(12) United States Patent
Swaminathan et al.

(10) Patent No.: US 8,956,983 B2
(45) Date of Patent: Feb. 17, 2015

(54) CONFORMAL DOPING VIA PLASMA ACTIVATED ATOMIC LAYER DEPOSITION AND CONFORMAL FILM DEPOSITION

(75) Inventors: Shankar Swaminathan, Hillsboro, OR (US); Mandyam Sriram, Beaverton, OR (US); Bart van Schravendijk, Sunnyvale, CA (US); Pramod Subramonium, Beaverton, OR (US); Adrien LaVoie, Portland, OR (US)

(73) Assignee: Novellus Systems, Inc., Fremont, CA (US)

(*) Notice: Subject to any disclaimer, the term of this patent is extended or adjusted under 35 U.S.C. 154(b) by 163 days.

(21) Appl. No.: 13/607,386

(22) Filed: Sep. 7, 2012

(65) Prior Publication Data

US 2013/0040447 A1 Feb. 14, 2013

Related U.S. Application Data

(63) Continuation-in-part of application No. 13/242,084, filed on Sep. 23, 2011, now Pat. No. 8,637,411, which is a continuation-in-part of application No. 13/084,399, filed on Apr. 11, 2011, now Pat. No.

(Continued)

(51) Int. Cl.
*H01L 21/469* (2006.01)
*H01L 21/31* (2006.01)
(Continued)

(52) U.S. Cl.
CPC .............. *C23C 16/045* (2013.01); *C23C 16/345* (2013.01); *C23C 16/401* (2013.01);
(Continued)

(58) Field of Classification Search
USPC ........................................ 438/763, 787, 702
See application file for complete search history.

(56) References Cited

U.S. PATENT DOCUMENTS

| | | | |
|---|---|---|---|
| 4,500,563 A | 2/1985 | Ellenberger et al. | |
| 5,496,608 A | 3/1996 | Matsuda et al. | |

(Continued)

FOREIGN PATENT DOCUMENTS

| | | |
|---|---|---|
| EP | 2 278 046 | 1/2011 |
| JP | 4364320 | 8/2009 |

(Continued)

OTHER PUBLICATIONS

U.S. Appl. No. 13/414,619, filed Mar. 7, 2012, entitled "Method for Depositing a Cholrine-Free Conformal Sin Film".

(Continued)

*Primary Examiner* — Luan C Thai
(74) *Attorney, Agent, or Firm* — Weaver Austin Villeneuve & Sampson LLP

(57) ABSTRACT

Disclosed herein are methods of doping a patterned substrate in a reaction chamber. The methods may include forming a first conformal film layer which has a dopant source including a dopant, and driving some of the dopant into the substrate to form a conformal doping profile. In some embodiments, forming the first film layer may include introducing a dopant precursor into the reaction chamber, adsorbing the dopant precursor under conditions whereby it forms an adsorption-limited layer, and reacting the adsorbed dopant precursor to form the dopant source. Also disclosed herein are apparatuses for doping a substrate which may include a reaction chamber, a gas inlet, and a controller having machine readable code including instructions for operating the gas inlet to introduce dopant precursor into the reaction chamber so that it is adsorbed, and instructions for reacting the adsorbed dopant precursor to form a film layer containing a dopant source.

41 Claims, 7 Drawing Sheets

Related U.S. Application Data 8,728,956, said application No. 13/242,084 is a continuation-in-part of application No. 13/084,305, filed on Apr. 11, 2011, now abandoned.

(60) Provisional application No. 61/324,710, filed on Apr. 15, 2010, provisional application No. 61/372,367, filed on Aug. 10, 2010, provisional application No. 61/379,081, filed on Sep. 1, 2010, provisional application No. 61/417,807, filed on Nov. 29, 2010, provisional application No. 61/649,114, filed on May 18, 2012.

(51) Int. Cl.

| | | |
|---|---|---|
| H01L 21/311 | (2006.01) | |
| C23C 16/04 | (2006.01) | |
| C23C 16/34 | (2006.01) | |
| C23C 16/40 | (2006.01) | |
| C23C 16/455 | (2006.01) | |
| C23C 16/56 | (2006.01) | |
| H01L 21/02 | (2006.01) | |
| H01L 21/768 | (2006.01) | |
| H01L 21/225 | (2006.01) | |
| H01L 29/66 | (2006.01) | |

(52) U.S. Cl.
CPC ......... *C23C16/402* (2013.01); *C23C 16/45523* (2013.01); *C23C 16/4554* (2013.01); *C23C 16/56* (2013.01); *H01L 21/02129* (2013.01); *H01L 21/02164* (2013.01); *H01L 21/0217* (2013.01); *H01L 21/022* (2013.01); *H01L 21/02274* (2013.01); *H01L 21/0228* (2013.01); *H01L 21/02348* (2013.01); *H01L 21/76898* (2013.01); *H01L 21/76831* (2013.01); *C23C 16/45531* (2013.01); *H01L 21/2255* (2013.01); *H01L 29/66803* (2013.01)
USPC ............................ 438/763; 438/787; 438/702

(56) References Cited

U.S. PATENT DOCUMENTS

| | | | |
|---|---|---|---|
| 5,670,432 | A | 9/1997 | Tsai |
| 5,856,003 | A | 1/1999 | Chiu |
| 5,874,368 | A | 2/1999 | Laxman et al. |
| 5,932,286 | A | 8/1999 | Beinglass et al. |
| 6,270,572 | B1 | 8/2001 | Kim et al. |
| 6,391,803 | B1 | 5/2002 | Kim et al. |
| 6,428,859 | B1 | 8/2002 | Chiang et al. |
| 6,468,924 | B2 | 10/2002 | Lee et al. |
| 6,528,430 | B2 | 3/2003 | Kwan et al. |
| 6,551,893 | B1 | 4/2003 | Zheng et al. |
| 6,576,053 | B1 | 6/2003 | Kim et al. |
| 6,632,478 | B2 | 10/2003 | Gaillard et al. |
| 6,645,574 | B1 | 11/2003 | Lee et al. |
| 6,723,595 | B2 | 4/2004 | Park |
| 6,730,614 | B1 | 5/2004 | Lim et al. |
| 6,743,738 | B2 | 6/2004 | Todd |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,930,060 | B2 | 8/2005 | Chou et al. |
| 6,943,092 | B2 | 9/2005 | Kim et al. |
| 6,962,876 | B2 | 11/2005 | Ahn et al. |
| 6,987,240 | B2 | 1/2006 | Jennings et al. |
| 7,001,844 | B2 | 2/2006 | Chakravarti et al. |
| 7,041,335 | B2 | 5/2006 | Chung |
| 7,077,904 | B2 | 7/2006 | Cho et al. |
| 7,081,271 | B2 | 7/2006 | Chung et al. |
| 7,109,129 | B1 | 9/2006 | Papasouliotis |
| 7,115,528 | B2 | 10/2006 | Vaartstra et al. |
| 7,122,222 | B2 | 10/2006 | Xiao et al. |
| 7,122,464 | B2 | 10/2006 | Vaartstra |
| 7,132,353 | B1 | 11/2006 | Xia et al. |
| 7,148,155 | B1 | 12/2006 | Tarafdar et al. |
| 7,151,039 | B2 | 12/2006 | Lee et al. |
| 7,172,792 | B2 | 2/2007 | Wang et al. |
| 7,176,084 | B2 | 2/2007 | Lee et al. |
| 7,205,187 | B2 | 4/2007 | Leith et al. |
| 7,223,649 | B2 | 5/2007 | Oh et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,314,835 | B2 | 1/2008 | Ishizaka et al. |
| 7,341,959 | B2 | 3/2008 | Brcka |
| 7,351,668 | B2 | 4/2008 | Chou et al. |
| 7,361,538 | B2 | 4/2008 | Luan et al. |
| 7,390,743 | B2 | 6/2008 | Shin |
| 7,393,561 | B2 | 7/2008 | Paranjpe |
| 7,419,888 | B2 | 9/2008 | Yang et al. |
| 7,435,454 | B2 | 10/2008 | Brcka |
| 7,435,684 | B1 | 10/2008 | Lang et al. |
| 7,462,571 | B2 | 12/2008 | Hasebe et al. |
| 7,482,247 | B1 | 1/2009 | Papasouliotis et al. |
| 7,488,694 | B2 | 2/2009 | Kim et al. |
| 7,507,676 | B2 | 3/2009 | Chou et al. |
| 7,510,984 | B2 | 3/2009 | Saito et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,601,648 | B2 | 10/2009 | Chua et al. |
| 7,615,438 | B2 | 11/2009 | Ahn et al. |
| 7,615,449 | B2 | 11/2009 | Chung et al. |
| 7,622,369 | B1 | 11/2009 | Lee et al. |
| 7,622,383 | B2 | 11/2009 | Kim et al. |
| 7,629,267 | B2 | 12/2009 | Wan et al. |
| 7,632,757 | B2 | 12/2009 | Matsuura |
| 7,633,125 | B2 | 12/2009 | Lu et al. |
| 7,638,170 | B2 | 12/2009 | Li |
| 7,645,484 | B2 | 1/2010 | Ishizaka |
| 7,651,729 | B2 | 1/2010 | Kim et al. |
| 7,651,730 | B2 | 1/2010 | Hasebe |
| 7,651,953 | B2 | 1/2010 | Todd et al. |
| 7,651,959 | B2 | 1/2010 | Fukazawa et al. |
| 7,682,657 | B2 | 3/2010 | Sherman |
| 7,713,592 | B2 | 5/2010 | Nguyen et al. |
| 7,758,920 | B2 | 7/2010 | Hasebe et al. |
| 7,776,733 | B2 | 8/2010 | Hasegawa |
| 7,825,039 | B2 | 11/2010 | Takahashi et al. |
| 7,919,416 | B2 | 4/2011 | Lee et al. |
| 7,923,068 | B2 | 4/2011 | Dickey et al. |
| 7,923,378 | B2 | 4/2011 | Hasebe et al. |
| 7,959,985 | B2 | 6/2011 | Ishizaka et al. |
| 7,964,241 | B2 | 6/2011 | Hasebe et al. |
| 7,964,513 | B2 | 6/2011 | Todd et al. |
| 7,981,473 | B2 | 7/2011 | Kim et al. |
| 7,989,365 | B2 | 8/2011 | Park et al. |
| 8,034,673 | B2 | 10/2011 | Kadonaga et al. |
| 8,080,290 | B2 | 12/2011 | Hasebe et al. |
| 8,101,531 | B1 | 1/2012 | Li et al. |
| 8,119,544 | B2 | 2/2012 | Hasebe et al. |
| 8,133,797 | B2 | 3/2012 | van Schravendijk et al. |
| 8,178,448 | B2 | 5/2012 | Nodera et al. |
| 8,227,032 | B2 | 7/2012 | Dussarrat et al. |
| 8,257,789 | B2 | 9/2012 | Matsunaga et al. |
| 8,278,224 | B1 | 10/2012 | Mui et al. |
| 8,334,218 | B2 | 12/2012 | Van Nooten et al. |
| 8,366,953 | B2 | 2/2013 | Kohno et al. |
| 8,383,525 | B2 | 2/2013 | Raisanen et al. |
| 8,394,466 | B2 | 3/2013 | Hong et al. |
| 8,524,612 | B2 | 9/2013 | Li et al. |
| 8,592,328 | B2 | 11/2013 | Hausmann et al. |
| 8,637,411 | B2 | 1/2014 | Swaminathan et al. |
| 8,647,993 | B2 | 2/2014 | Lavoie et al. |

(56) References Cited

U.S. PATENT DOCUMENTS

| | | |
|---|---|---|
| 8,728,956 B2 | 5/2014 | LaVoie et al. |
| 2002/0076507 A1 | 6/2002 | Chiang et al. |
| 2004/0033698 A1 | 2/2004 | Lee et al. |
| 2004/0053515 A1 | 3/2004 | Comita et al. |
| 2004/0231799 A1 | 11/2004 | Lee et al. |
| 2005/0042865 A1 | 2/2005 | Cabral et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0196977 A1 | 9/2005 | Saito et al. |
| 2005/0233553 A1 | 10/2005 | Kountz et al. |
| 2005/0260347 A1 | 11/2005 | Narwankar et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0137572 A1 | 6/2007 | Matsuura et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0232082 A1 | 10/2007 | Balseanu et al. |
| 2007/0251444 A1 | 11/2007 | Gros-Jean et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0029283 A1 | 2/2009 | Honda |
| 2009/0041952 A1 | 2/2009 | Yoon et al. |
| 2009/0065896 A1 | 3/2009 | Hwang |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0203197 A1* | 8/2009 | Hanawa et al. ............... 438/513 |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0086516 A1 | 4/2011 | Lee et al. |
| 2011/0151142 A1 | 6/2011 | Seamons et al. |
| 2011/0159202 A1 | 6/2011 | Matsushita et al. |
| 2011/0198756 A1 | 8/2011 | Thenappan et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0164846 A1 | 6/2012 | Ha et al. |
| 2012/0213940 A1 | 8/2012 | Mallick |
| 2012/0282418 A1 | 11/2012 | Chou et al. |
| 2012/0315394 A1 | 12/2012 | Ito |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0209562 A1 | 7/2014 | LaVoie et al. |
| 2014/0216337 A1 | 8/2014 | Swaminathan et al. |

FOREIGN PATENT DOCUMENTS

| | | |
|---|---|---|
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0080019 | 7/2009 |
| KR | 10-2009-0081396 | 7/2009 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Appl. No. 13/472,282, filed May 15, 2012, entitled "Methods for UV-Assisted Conformal Film Deposition".

US Office Action dated Mar. 15, 2013 issued in U.S. Appl. No. 13/084,399.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Office Action dated Apr. 4, 2013 issued U.S. Appl. No. 13/242,084.

US Office Action dated Apr. 29, 2013 issued U.S. Appl. No. 13/224,240.

US Office Action dated May 24, 2013 issued U.S. Appl. No. 13/472,282.

PCT International Search Report and Written Opinion, dated Oct. 20, 2011, issued in PCT/US2011/032186.

PCT International Preliminary Report on Patentability dated Oct. 26, 2012, issued in PCT/US2011/032186.

PCT Invitation to Pay Additional Fees; Communication Re Partial International Search, dated Dec. 16, 2011, issued in PCT/US2011/032303.

PCT International Search Report and Written Opinion, dated Feb. 20, 2012, issued in PCT/US2011/032303.

(56) References Cited

OTHER PUBLICATIONS

PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
PCT International Search Report and Written Opinion dated Dec. 18, 2012, issued in Application No. PCT/US2012/052769.
PCT International Search Report and Written Opinion dated Feb. 28, 2013, issued in Application No. PCT/US2012/051740.
Cecchi et al., "Ultra-thin conformal pore-sealing of low-k materials by plasma-assisted ALD," University of New Mexico, Albuquerque, NM, Sandia National Labs, Albuquerque, NM (2007).
Choi, Gyu-Jin et al., (2009) "Plasma-enhanced atomic layer deposition of TiO2 and Al-doped TiO2 films using N2O and O2 reactants," Journal of the Electrochemical Society, 156 Iss, 9 pp. G138-G143.
King, Sean W., "Plasma enhanced atomic layer deposition of $SiN_x$:H and $SiO_2$," J. Vac. Sci. Technol. A 29(4), Jul./Aug. 2011.
Lee et al., "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, Microelectronic Engineering 80 (2005).
Lee, Jong Ju, Low-impurity, highly conformal atomic layer deposition of titanium nitride using $NH_3$-Ar-$H_2$ plasma treatment for capacitor electrodes, Lawrence Berkeley National Laboratory, University of California, Berkeley, CA (2004).
Man P.F. et al., "Elimination of Post-Release Adhesion in Microstructures Using Conformal Fluorocarbon Coatings," MEMS'96 Proceedings, IEEE Feb. 11-15, 1996, pp. 55-60.
Nguyen, S.V. et al., Plasma-assist chemical vapor deposition of dielectric thin films for ULSI semiconductor circuits, IBM J.Res. Develop. vol. 43, No. 1.2, Jan./Mar. 1999, pp. 5-38.
Plasma Enhanced Atomic Layer Deposition (PEALD), Website: http://www.asm.com/index.php?option=com_content&task=view& id=19&Itemid=161 (2010).
"PlasmaPro," Oxford Instruments (2010).
U.S. Appl. No. 14/194,549, filed Feb. 28, 2014, entitled "Capped ALD Films for Doping Fin-Shaped Channel Regions of 3-D IC Transistors."
U.S. Appl. No. 14/183,287, filed Feb. 18, 2014, entitled "High Growth Rate Process for Conformal Aluminum Nitride."
U.S. Appl. No. 14/187,145, filed Feb. 21, 2014, entitled "Plasma Assisted Atomic Layer Deposition Titanium Oxide for Conformal Encapsulation and Gap Fill Applications."
U.S. Appl. No. 14/195,653, filed Mar. 3, 2014 entitled "RF Cycle Purging to Reduce Surface Roughness in Metal Oxide and Metal Nitride Films."
U.S. Appl. No. 14/194,324, filed Feb. 28, 2014, entitled "Soft Landing Nanolaminates for Advanced Patterning."
U.S. Appl. No. 14/335,785, filed Jul. 18, 2014, entitled "Methods for Depositing Silicon Oxide."
US Final Office Action dated Sep. 13, 2013 issued in U.S. Appl. No. 13/084,399.
US Notice of Allowance dated Jan. 15, 2014 issued in U.S. Appl. No. 13/084,399.
US Notice of Allowance dated Jun. 19, 2013 issued U.S. Appl. No. 13/242,084.
US Notice of Allowance dated Sep. 19, 2013 issued U.S. Appl. No. 13/242,084.
US Notice of Allowance dated Aug. 7, 2014 issued U.S. Appl. No. 14/133,239.
US Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Office Action dated Jun. 7, 2013 issued U.S. Appl. No. 13/414,619.
US Notice of Allowance dated Jul. 26, 2013, issued U.S. Appl. No. 13/414,619.
US Office Action dated Apr. 11, 2014 issued in U.S. Appl. No. 14/065,334.
US Notice of Allowance dated Oct. 4, 2013 issued U.S. Appl. No. 13/472,282.
US Office Action dated Jun. 13, 2014 issued in U.S. Appl. No. 13/953,616.
US Office Action dated Jul. 10, 2014 issued in U.S. Appl. No. 14/144,107.
PCT International Preliminary Report on Patentability and Written Opinion dated Apr. 3, 2014, issued in Application No. PCT/US2012/052769.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Hausmann et al. (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Li, Xingcun, et al., (2011) "Atomic Layer Deposition Al2O3 Thin Films in Magnetized Radio Frequency Plasma Source," Physics Procedia 18:100-106.
van der Straten et al. (2004) "Atomic layer deposition of tantalum nitride for ultrathin liner applications in advanced copper metallization schemes," Journal of Materials Research, 19(2):447-453.

\* cited by examiner

US 8,956,983 B2

CONFORMAL DOPING VIA PLASMA ACTIVATED ATOMIC LAYER DEPOSITION AND CONFORMAL FILM DEPOSITION

CROSS REFERENCE TO RELATED APPLICATIONS

This application is a continuation-in-part of, and claims priority to, U.S. patent application Ser. No. 13/242,084, filed Sep. 23, 2011, and titled "PLASMA ACTIVATED CONFORMAL DIELECTRIC FILM DEPOSITION."

U.S. patent application Ser. No. 13/242,084 is a continuation-in-part of U.S. patent application Ser. No. 13/084,399, filed Apr. 11, 2011, titled "PLASMA ACTIVATED CONFORMAL DIELECTRIC FILM DEPOSITION," which claims priority to U.S. Provisional Patent Application No. 61/324,710, filed Apr. 15, 2010, and U.S. Provisional Patent Application No. 61/372,367, filed Aug. 10, 2010, and U.S. Provisional Patent Application No. 61/379,081, filed Sep. 1, 2010, and U.S. Provisional Patent Application No. 61/417,807, filed Nov. 29, 2010.

U.S. patent application Ser. No. 13/242,084 is also a continuation-in-part of U.S. patent application Ser. No. 13/084,305, filed Apr. 11, 2011.

This application also claims priority to U.S. Provisional Patent Application No. 61/649,114, filed May 18, 2012, and titled "METHODS OF DEPOSITING DOPED ALD OXIDES."

All of the foregoing listed provisional and nonprovisional patent applications are hereby incorporated by reference herein in their entirety for all purposes.

BACKGROUND

Currently, there is substantial interest in three-dimensional (3D) transistor structures such as multi-gate FinFETs and 3D memory devices. Examples of some 3D structures can be found in "Tri-gate," J. Kavalieros et al. (Intel), *Symp. VLSI Tech*, p. 50 (2006), and "Opportunities and Challenges of FinFET as a Device Structure Candidate for 14 nm Node CMOS Technology," *ECS Transactions*, Vol. 34, Issue 1, pp. 81-86 (2011), both hereby incorporated by reference herein in their entireties and for all purposes. Advanced 3D gate structures are being employed in the 22 nm technology node, and likely in further technology nodes having features sizes below 22 nm. Transistors with 3D gate structures typically employ source and drain regions formed in thin vertical structures. These vertical structures are difficult to dope using conventional ion implantation techniques, plasma doping techniques, and generally, techniques which involve transport of ions under an electric field. The difficulty is generally manifest when doping sidewalls, and especially manifest in high aspect ratio structures.

Thus, since ion implantation processes are largely directional, they tend to be incompatible with the fabrication of many gate architecture designs, such as 3D gate designs and/or gate architectures having closely spaced fins which may require doping on lateral and vertical surfaces. If attempt is made to use ion implantation for doping these surfaces such as by changing the implant tilt angle, this may lead to considerable variability in the dopant dose retention and diffusion range, especially on the sidewalls. Frequently, in a dense array of i3D structures, there can be shadowing effects for the directional ion beam in an implanter, giving rise to serious dose retention problems for tilted implant angles. There has also been recent interest in the plasma doping technique.

However, there appear to be two primary disadvantages to this technique: (a) it may lead to simultaneous sputter erosion, which may be due to the high energy ions in the plasma, and (b) dopant dose and conformality seem to sensitively depend on the ion to radical density ratio in the plasma, which leads to difficulties in process control. Thus, there is an ongoing need for better doping methods which may be used to fabricate many current gate architecture designs.

SUMMARY OF THE DISCLOSURE

Disclosed herein are methods of doping a patterned substrate in a reaction chamber. In some embodiments, the methods include forming a first conformal film layer directly on a surface of the patterned substrate having three-dimensional features or on a material adhered to the surface, the first film layer comprising a dopant source, the dopant source comprising a dopant, and driving some of the dopant from the first film layer into the substrate to form a conformal doping profile in the substrate. In some embodiments, forming the first film layer includes introducing a dopant precursor into the reaction chamber, adsorbing the dopant precursor directly onto the surface of the patterned substrate or onto a material adhered to the surface under conditions whereby the dopant precursor forms an adsorption-limited layer, and reacting the adsorbed dopant precursor to form the dopant source.

In some embodiments, forming the first film layer may include atomic layer deposition and may also include removing unadsorbed dopant precursor from the reaction chamber. In certain such embodiments, the removing step may occur after the adsorbing step but prior to the reacting step. In some embodiments, the removing step may include pumping unadsorbed dopant precursor out of the reaction chamber, by pumping the reaction chamber to a base pressure with a vacuum pump, whereas in some embodiments, the removing step may include purging the reaction chamber with an inert gas.

Some methods disclosed herein may additionally include forming a second conformal film layer containing a dielectric material, and some methods disclosed herein may additionally include forming a third conformal film layer on a material adhered to the surface of the substrate, the third film layer comprising the dopant source, the dopant source comprising the dopant, wherein a substantial portion of the second film layer is interspersed between the first and third film layers. In certain such embodiments, the methods may further include driving some of the dopant from the third film layer into the substrate to form a conformal doping profile in the substrate. In some embodiments, forming the third film layer may include introducing the dopant precursor into the reaction chamber, adsorbing the dopant precursor onto a material adhered to the surface under conditions whereby the dopant precursor forms an adsorption-limited layer, and reacting the adsorbed dopant precursor to form the dopant source. In some embodiments, adsorbing the dopant precursor when forming the first film layer may include atomic layer deposition, and adsorbing the dopant precursor when forming the third film layer may include atomic layer deposition. In some embodiments, forming the first film layer may include removing unadsorbed dopant precursor from the reaction chamber, and forming the third film layer may include removing unadsorbed dopant precursor from the reaction chamber. In some embodiments, during the formation of each of the first and third film layers the removing step occurs after the adsorbing step but prior to the reacting step. In some embodiments, the removing may include pumping unadsorbed dopant precursor out of the reaction chamber by pumping the reaction chamber to a base pressure with a vacuum pump. In some embodiments, the removing may include purging the reaction chamber with an inert gas.

In some embodiments, reacting the adsorbed dopant precursor to form the first film layer may include activation with a plasma, and reacting the adsorbed dopant precursor to form the third film layer may include activation with the plasma. In some embodiments, the plasma is an oxidizing plasma. In some embodiments, the plasma is an inert plasma. In some embodiments, the driving of some of the dopant from the first and third film layers may include a thermally mediated diffusion process. In some embodiments, the thermally mediated diffusion process involves annealing. In some embodiments, the annealing is laser spike annealing.

In some embodiments, the dopant may include a valence III or V element. In some embodiments, the element is boron, phosphorus, germanium, or arsenic. In some embodiments, the dopant is boron, the dopant precursor is an alkyl borate, and the dopant source is a boron oxide or boron oxyhydride. In some embodiments, the alkyl borate is trimethyl borate. In some embodiments, the boron oxide is $B_2O_3$. In some embodiments, the dopant is arsenic, the dopant precursor is a selected from the alkylarsine, alkoxyarsine, and aminoarsine chemical families, and the dopant source is an arseno-silicate, an arsenic-doped silicate glass, an arsenic oxide, or an arsenic oxyhydride. In some embodiments, the dopant precursor is arsine, triethylaresenate, trimethylarsine, triethylarsine, triphenylarsine, triphenylarsine oxide, ethylenebis(diphenylarsine), tris(dimethylamino)arsine, or an arsenic containing compound having the chemical formula $As(OR)_3$ where R is —$CH_3$ or —$C_2H_5$. In some embodiments, the dopant source is $As_2O_3$ and/or $As_2O_5$. In some embodiments, the dielectric material of the second film layer is $SiO_2$.

Some methods disclosed herein may additionally include forming a fourth conformal film layer containing the dielectric material, and some methods disclosed herein may additionally include forming a fifth conformal film layer on a material adhered to the surface of the substrate, the fifth film layer comprising the dopant source, the dopant source comprising the dopant, wherein a substantial portion of the fourth film layer is interspersed between the third and fifth film layers. In certain such embodiments, the methods may further include driving some of the dopant from the fifth film layer into the substrate to form a conformal doping profile in the substrate. In certain such embodiments, forming the fifth film layer may include introducing the dopant precursor into the reaction chamber, adsorbing the dopant precursor onto a material adhered to the surface under conditions whereby the dopant precursor forms an adsorption-limited layer, and reacting the adsorbed dopant precursor to form the dopant source. Some methods disclosed herein may additionally include forming a sixth film layer which is a capping layer, the capping layer being the outermost film layer of the first through sixth film layers relative to the substrate. In certain such embodiments, the capping layer comprises $SiO_2$.

In some methods disclosed herein, forming the second film layer may include introducing a reactant into the reaction chamber, introducing a dielectric precursor into the reaction chamber, adsorbing the dielectric precursor onto a material adhered to the substrate under conditions whereby the dielectric precursor forms an adsorption-limited layer, and reacting the reactant with the adsorbed dielectric precursor to form the dielectric material. In some methods disclosed herein, forming the fourth film layer may include introducing the reactant into the reaction chamber, introducing a dielectric precursor into the reaction chamber, adsorbing the dielectric precursor onto a material adhered to the substrate under conditions whereby the dielectric precursor forms an adsorption-limited layer, and reacting the reactant with the adsorbed dielectric precursor to form the dielectric material. In certain such embodiments, the reactant may be an oxidant such as elemental oxygen, nitrous oxide, water, an alkyl alcohol, carbon monoxide, or carbon dioxide. In some embodiments, reacting the reactant with the adsorbed dielectric precursor to form the dielectric material may include activation with a plasma. In some embodiments, the dielectric precursor may be selected from the group consisting of alkylamino silanes ($SiH_x(NR_2)_{4-x}$), where x=1-3, and R includes alkyl groups, and halosilanes ($SiH_xY_{4-x}$), where x=1-3, and Y includes Cl, Br, and I. In some embodiments the dielectric precursor may be BTBAS.

In some embodiments, each of the first through fifth film layers is a monolayer. In some embodiments, the average thickness of each of the first through fifth film layers is between 0.1 and 2 Angstroms. In some embodiments, at least one of the three-dimensional features has a width of not greater than about 40 nanometers. In some embodiments, the average concentration of dopant over the first through fifth film layers is between about 0.01 and 10 percent by weight.

Also disclosed herein are methods of doping a patterned substrate in a reaction chamber which include forming an alloy comprising a dielectric and a dopant source directly on a surface of the patterned substrate having three-dimensional features, or onto a material adhered to the surface, the dopant source comprising a dopant, and driving some of the dopant from the alloy into the substrate to form a conformal doping profile in the substrate. In certain such embodiments, forming the alloy may include introducing a dopant precursor and a dielectric precursor into the reaction chamber, coadsorbing the dopant precursor and the dielectric precursor onto the substrate or onto a material adhered to the substrate under conditions whereby the dopant precursor and the dielectric precursor form an adsorption-limited layer, and reacting the adsorbed dopant precursor and adsorbed dielectric precursor to form the dopant source and alloy having the dopant source. In some embodiments, forming the alloy may include introducing a third reactant into the reaction chamber and reacting the third reactant with the adsorbed dielectric precursor. In some embodiments, the third reactant may be an oxidant. In some embodiments, reacting the third reactant with the adsorbed dielectric precursor further comprises activation with a plasma.

Also disclosed herein are apparatuses for doping a substrate. In some embodiments, the apparatus may include a reaction chamber, a substrate holder within the reaction chamber, one or more dopant precursor gas inlets coupled to the reaction chamber, one or more vacuum pumps, one or more gas outlets coupling the reaction chamber to the one or more vacuum pumps, and a controller comprising machine readable code. In certain such embodiments, the code may include instructions for determining that a substrate is present on the substrate holder, instructions for operating the one or more dopant precursor gas inlets to introduce dopant precursor into the reaction chamber so that the dopant precursor adsorbs onto the substrate or onto a material adhered to the substrate, instructions for operating the one or more gas outlets to evacuate unadsorbed dopant precursor from the reaction chamber, and instructions for reacting the adsorbed dopant precursor to form a film layer containing a dopant source. In some embodiments, the apparatuses disclosed herein may further include an RF generator configured to excite a plasma within the reaction chamber. In certain such embodiments, the instructions for reacting the adsorbed dopant precursor may include instructions for operating the RF generator to excite a plasma which causes the adsorbed dopant precursor to react. In some embodiments, the machine readable code comprising the controller may further include instructions for driving some of the dopant source from the film into the substrate. In some embodiments, the apparatuses disclosed herein may further include a heater configured to heat the film containing the dopant source. In certain such embodiments, the instructions for driving some of the dopant into the substrate may include instructions for operating the heater to heat the film causing a thermally mediated diffusion of dopant from the film into the substrate.

DETAILED DESCRIPTION

Figure 1:
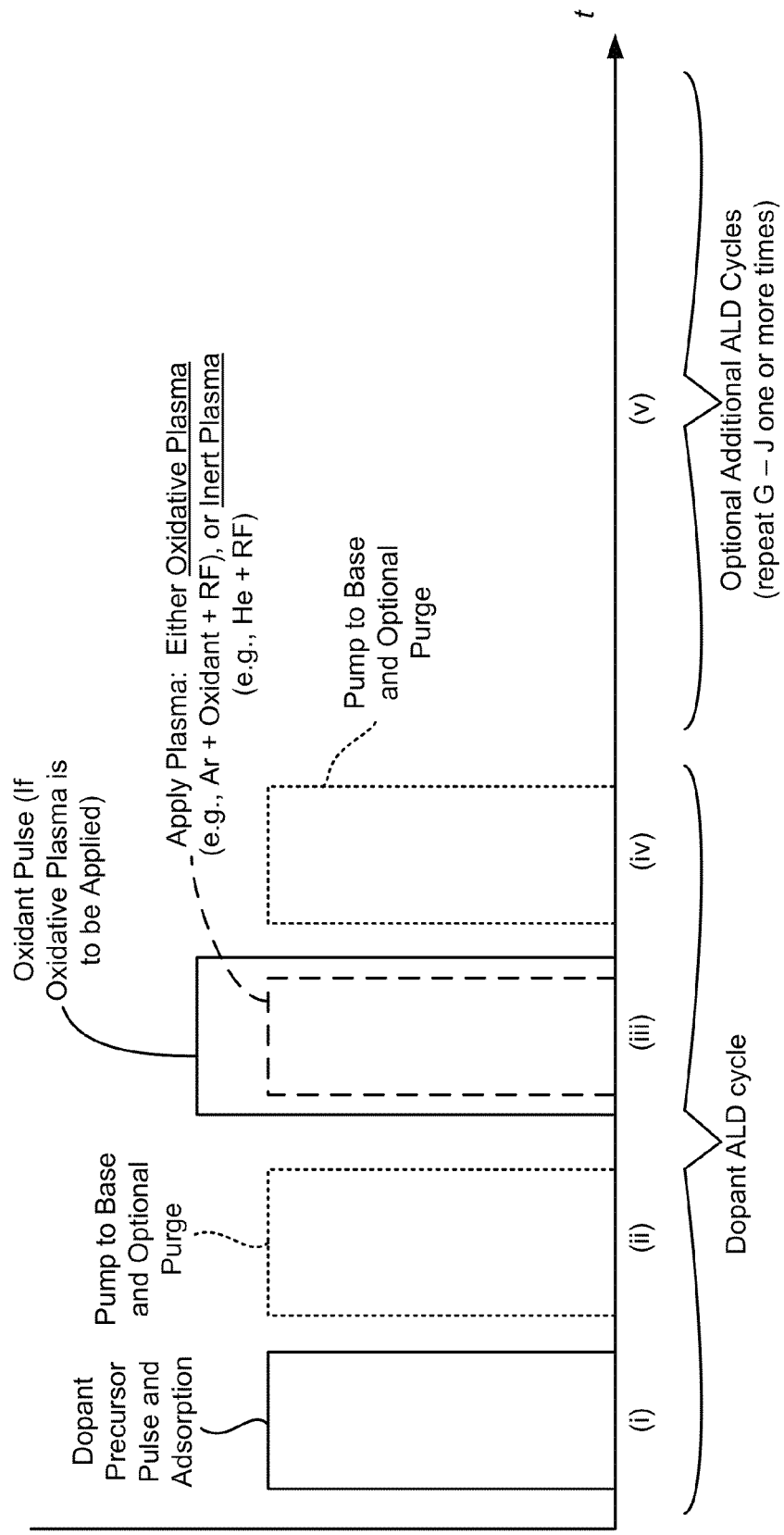
FIG. 1 is a schematic illustration of a sequence of operations which may be used for forming one or more dopant source containing conformal film layers via an ALD process.

Solid-state diffusion of p-type and n-type dopants from conformally deposited films are presented herein as an alternative to doping substrates using the incumbent ion implantation technology. Doping via conformally deposited films may be superior to ion implantation when doping, for example, 3D structures such as the ultrashallow junction regions and/or source/drain extension regions of 3D transistors (such as pMOS FinFETs). Generally, doping via conformally deposited films is useful for doping many high aspect ratio devices structures, and may be appropriately used in many scenarios where conventional ion implantation or directional doping methods are inadequate. Such conformal doping may employ the use of deposition techniques such as atomic layer deposition (ALD). In some contexts, a form of ALD referred to as conformal film deposition (CFD) is employed. In particular, when a thin layer of n-doped or p-doped conformal film is formed via ALD over the vertical surfaces of device structures, conformal doping of these vertical surfaces may be accomplished. Such conformal doping has been observed in some cases to increase current density in 3D devices by 10% to 25% due to decreased series resistance. See Yamashita et al., VLSI 2011. In addition to conventional silicon-based microelectronics, other applications of ALD doping include microelectronics and optoelectronics based on III-V semiconductors such as GaAs, and II-VI semiconductors such as HgCdTe, as well as photovoltaics, flat panel displays, and electrochromic technology.

Doping via conformally deposited films involves the formation of one or more dopant source conformal film layers—e.g., on the lateral and vertical surfaces of a high-aspect ratio device structure—which contain a dopant source. In some embodiments, the dopant source layers may be interspersed with silicon oxide conformal film layers, the layers formed by growing them sequentially, one after the other, on top of one another. Once a sufficient number of dopant source layers are present, dopant may be transferred to the substrate by driving some of the dopant from the dopant source conformal film layers into the substrate, such as an underlying silicon substrate. Note that the dopant driven into the substrate and the dopant source in the conformal film layer(s) may be one and the same, or the dopant driven into the substrate may be a species chemically related to the dopant source, such as, for example, the dopant source may be an phosphorus containing compound, and the dopant itself may be the phosphorous atom within the phosphorous containing compound.

In some embodiments, it may be possible to use a chemical vapor deposition (CVD) process to deposit dopant source layers. In some embodiments, dopant source layers formed via CVD may be interspersed with conformal silicon oxide layers. However, it has been found that CVD formed dopant source layers grown thermally by flowing $B_2H_6$ (or $PH_3$ or $AsH_3$ (arsine) for n-type doping) may, in some cases, exhibit less than optimal within-wafer uniformity, both in terms of incorporation of dopant into the as-deposited dopant source film layer, as well as transfer of dopant into the underlying substrate. Moreover, arrays of 3D structures on the same die with different geometric constraints may exhibit pattern loading. That is, features with different geometric characteristics (e.g., different aspect ratios) may have different doping profiles when CVD-based dopant source layers are used.

In some embodiments, atomic layer deposition (ALD) may be used to deposit the dopant source containing conformal film layers. In some embodiments, these layers may be interspersed with conformal oxide layers. In some embodiments, oxide or oxyhydride film layers deposited via ALD may be used as dopant source containing conformal film layers. In certain such embodiments, the dopant precursor used to form these layers may be an organic metal precursor. In certain such embodiments, trimethyl borate (TMB) may be used as an ALD dopant precursor in a process of forming boron-containing conformal film layers interspersed with oxide layers to form an oxide stack. In other embodiments, an arsenic (As) doped silicate glass (ASG) or arsenic oxide (e.g., $As_2O_3$, $As_2O_5$), or a phosphorus (P) doped silicate glass (PSG) or phosphorous oxide (e.g., $P_2O_5$) may serve as the dopant source in a conformal film layer formed via ALD. As described below, plasma activation may be used after adsorption of dopant precursor to produce conformal films containing $B_2O_3$, or $P_2O_5$ or PSG or ASG, or $As_2O_3$, or $As_2O_5$. Depending on the embodiment, certain stack engineering concepts may be used to modulate boron, phosphorus, or arsenic concentration in these films. Of course, other dopant precursors may also be employed in ALD processes to produce dopant source conformal film layers, and depending on the dopant precursor, conformal film layers containing gallium, phosphorus, and their respective oxides and oxyhydrides, etc., may be produced.

A dopant source containing conformal film layer is termed a "source" layer because it provides a source of dopant species (e.g., dopant atoms such as boron, phosphorus, gallium, and/or arsenic). The dopant source layer serves as a source of dopant for doping an underlying (or overlying) structure in a device. After the dopant source layer is formed (or during its formation), dopant species are driven or otherwise incorporated into adjacent structures in the device being fabricated. In some embodiments, the dopant species are driven by an annealing operation during or after forming the dopant source conformal film layer. As indicated above, the substantially conformal nature of dopant source layers deposited using ALD permits the effective doping of non-conventional device structures including, for example, structures which require doping in 3D. In some embodiments, a dielectric layer serves as the base source layer into which the dopant species is incorporated. For example, doped silicon oxide may be used as a diffusion source for boron, phosphorus, arsenic, germanium, etc. In some embodiments, a boron doped silicate glass (BSG), a phosphorus doped silicate glass (PSG), a boron-phosphorus doped silicate glass (BPSG), or an arsenic doped silicate glass (ASG), etc. may be used.

Conformal films formed using ALD and containing a dopant source for diffusion into an underlying substrate may have various benefits and advantages. First, in some embodiments, oftentimes highly conformal films may be formed by ALD processes at fairly low temperatures. A high degree of conformality to these films is beneficial because a film layer used for doping an underlying layer may be sacrificial, and to the extent these films are non-conformal, removal may result in overetching (or underetching/undercutting), posing significant challenges. ALD processes may also provide conformal films with extremely well-controlled doping concentrations. In some embodiments, this may be achieved by using ALD to intersperse doped layers with layers of undoped oxide, and by varying the proportion of doped to undoped layer in order to precisely control the overall stack concentration of dopant source species. In other words, the level of doping can be tightly controlled by the frequency with which the doped layer is deposited with the undoped layers, and also by controlling the conditions of the doping cycle which affect the concentration of dopant in the dopant source containing layers. For instance, in some embodiments, a dopant source with significant steric hindrance may provide a mechanism for controlling the characteristics of the deposited doped layers.

Furthermore, conformal films deposited via ALD may have other applications besides being used as a dopant source for an underlying substrate. Other applications for conformal oxide films deposited via ALD include, but are not limited to, interlayer dielectric (ILD) applications, intermetal dielectric (IMD) applications, pre-metal dielectric (PMD) applications, dielectric liners for through-silicon via (TSV) applications, resistive RAM (ReRAM) applications, and/or stacked capacitor fabrication in DRAM applications.

Other uses for ALD glasses include, but are not limited to, passivation, reflow, hermetic sealing, capacitor dielectrics, etc.

Furthermore, in some embodiments, doped films may find application as etchable layers, such as high-etch-rate sacrificial oxides, used at various stages in integrated circuit (IC) fabrication, such as during the patterning stages of IC fabrication. In certain such embodiments, an etchable layer for use in IC fabrication may be a glass layer having tunable wet etching rates, where the etch rate is tunable by the level of doping. In other words, the level of doping is chosen to provide a pre-defined etch rate. Such doped films may be conformal films deposited via ALD. In specific embodiments, the etchable layer is a silicate glass layer containing a dopant such as arsenic, phosphorus, boron, germanium, or combinations thereof. In particular, boron containing silicate glass (BSG) deposited via ALD has a much higher etch rate than undoped CFD oxide or thermal oxide and the etch rate of BSG appears to be tunable with boron concentration. Thus, doped conformal films deposited via ALD may simply be used as conformal sacrificial layers or spacers in front-end-of-line (FEOL) structures. Faster etch rates and selectivity with underlying layers are key characteristics in selecting the etch-rate selective ALD conformal film.

Formation of Dopant Source Containing Conformal Film Layers Via ALD

The concept of an ALD "cycle" is important to various portions of the discussion that follows, and in particular, relevant to portions of the discussion regarding deposition of multiple conformal film layers via multiple "cycles" of ALD. Generally, a basic set of steps which results in the deposition of at least a partial conformal film layer on a substrate surface may be referred to as a single ALD "cycle." Typically, an ALD cycle will include only those steps necessary to deliver and adsorb each reactant to the substrate surface, and then react those adsorbed reactants to form the partial layer of film. Of course, the cycle may include certain ancillary steps such as sweeping one of the reactants or byproducts out of the reaction chamber, and/or applying a treatment to the deposited conformal film layer (or partial film layer). Generally, a cycle represents a single iteration of a unique set of operations which result in the deposition of a whole or partial conformal film layer.

FIG. 1 displays a schematic illustrating a general sequence of operations from left to right with advancing time along the horizontal axis which may be used for forming one or more dopant source containing conformal film layers via an ALD process. Note that this schematic simply illustrates a baseline sequence of steps and that other ancillary operations may be added, substituted, and/or interspersed with the illustrated operations, depending on the embodiment, and the nature of the dopant source and corresponding dopant precursor species, as well as the application of the ALD formed conformal film layers.

Referring to FIG. 1, in operation (i) a suitable dopant precursor is introduced into the reaction chamber and adsorbed onto the substrate surface (or onto a material adhered to the substrate) under conditions whereby the dopant precursor may form an adsorption-limited layer (given a sufficient time duration and a sufficient quantity of precursor). The duration of operation (i) is chosen to allow the precursor to adsorb onto the substrate surface in an amount sufficient to support one cycle of ALD film growth. In some embodiments, the precursor saturates the substrate surface forming the aforementioned adsorption limited layer. In other embodiments, the layer is formed by only partially saturating the substrate surface with precursor (e.g., because of insufficient quantities of precursor or time for full saturation). In certain embodiments, the dopant precursor is provided to the reaction chamber by flowing it with a carrier gas. An inert gas, such as argon, may serve this purpose. Following adsorption of dopant precursor, in operation (ii), remaining unadsorbed dopant precursor still present in the reaction chamber is removed, for example by pumping the reaction chamber down to a base pressure (referred to as "pump-to-base"), and/or optionally purging the reaction chamber with an inert gas (referred to as "inert purge") to flush out any remnant unadsorbed dopant precursor. Reaction of the adsorbed dopant precursor then takes place in operation (iii), wherein the reaction proceeds via plasma activation, using inert plasma activation and/or oxidizing plasma activation to form the layer of dopant source containing conformal film. Finally, in operation (iv) another pump-to-base and/or inert purge is performed to remove any reaction by-products. Operations (i) through (iv) collectively may be referred to as an ALD cycle, as described above, and provide for a single cycle of dopant ALD film deposition. FIG. 1 also schematically illustrates, see operation (v), that this ALD cycle may be repeated one or more times to form multiple dopant source containing conformal film layers. Thus, in some embodiments, operations (i) through (iv) are repeated consecutively at least 1 time, or at least 2 times, or at least 3 times, or at least 5 times, or at least 7 times, or at least 10 times in a row. Dopant ALD film may be deposited at a rate of about or between 0.1 Å and 2.5 Å per ALD cycle, or about or between 0.2 Å and 2.0 Å per ALD cycle, or about or between 0.3 Å and 1.8 Å per ALD cycle, or about or between 0.5 Å and 1.5 Å per ALD cycle, or about or between 0.1 Å and 1.5 Å per ALD cycle, or about or between 0.2 Å and 1.0 Å per ALD cycle, or about or between 0.3 Å and 1.0 Å per ALD cycle, or about or between 0.5 Å and 1.0 Å per ALD cycle.

A variety of dopant precursors may be used in conjunction with the foregoing sequence of operations to form dopant source containing conformal film layers. In some embodiments, a suitable dopant source may be elemental arsenic or an arsenic-doped silicate glass (ASG), or an arsenic compound such as $As_2O_3$ and/or $As_2O_5$. In other embodiments, a suitable dopant source may be elemental boron or a boron compound such as $B_2O_3$, and a suitable dopant precursor may be a boron compound such as an alkyl borate. For instance, trimethyl borate (TMB) (shown below) is a particular alkyl borate which has worked well as a dopant precursor for forming the dopant source $B_2O_3$, however other dopant precursors may also be suitable for forming various boron-based dopant sources. Furthermore, as detailed below, dopant sources based upon elements other than boron and arsenic may also be suitable, such as dopant sources based upon gallium or phosphorous, for example.

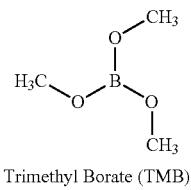

Trimethyl Borate (TMB)

As indicated above, plasma activation in operation (iii) may involve exposure of adsorbed dopant precursor to either an oxidizing plasma or an inter plasma. The oxidizing plasma may be formed from one or more oxidants such as $O_2$, $N_2O$, or $CO_2$, and may optionally include one or more diluents such as Ar, $N_2$, or He. In one embodiment, the oxidizing plasma is formed from $O_2$ and Ar. A suitable inert plasma may be formed from one or more inert gases such as He or Ar. Note that inert plasma activation may require longer durations of RF radiation—in some embodiments greater than 10 seconds—in order to generate a plasma which will create sufficient reactivity in the adsorbed dopant precursor. Without being limited to a particular theory, the longer purge duration may be attributed to the longer lifetimes associated with He (or other inert) metastable species.

Once again, in some embodiments, a pump-to-base step refers to pumping the reaction chamber to a base pressure by directly exposing it to one or more vacuum pumps. In some embodiments, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Atomic layer deposition to form dopant source containing conformal film layers may be performed at various temperatures. In some embodiments, suitable temperatures within the reaction chamber may range from about or between 25 C and 450 C, or about or between 50 C and 300 C, or about or between 20 C and 400 C, or about or between 200 C and 400 C, or about or between 100 C and 350 C. However, note that unlike a thermal CVD process involving $B_2H_6$, for example, mere introduction of TMB (or other dopant precursor) will not form a layer of $B_2O_3$—instead surface adsorption of dopant precursor is followed by a plasma activation step (as described). Atomic layer deposition to form dopant source containing conformal film layers may be performed at various chamber pressures. In some embodiments, suitable pressures within the reaction chamber may range from about or between 10 mTorr and 10 Torr, or about or between 20 mTorr and 8 Torr, or about or between 50 mTorr and 5 Torr, or about or between 100 mTorr and 2 Torr. Various RF power levels may be employed to generate the plasma used in operation (iii). In some embodiments, suitable RF power may range from about or between 100 W and 10 kW, or about or between 200 W and 6 kW, or about or between 500 W, and 3 kW, or about or between 1 kW and 2 kW. Various dopant precursor flow rates may be employed in operation (i). In some embodiments, suitable flow rates may range from about or between 0.1 mL/min to 10 mL/min, or about or between 0.5 mL/min and 5 mL/min, or about or between 1 mL/min and 3 mL/min. Various gas flow rates may be used in the various operations. In some embodiments, general gas flow rates may range from about or between 1 L/min and 20 L/min, or about or between 2 L/min and 10 L/min. For the optional inert purge steps in operations (ii) and (iv), an employed burst flow rate may range from about or between 20 L/min and 100 L/min, or about or between 40 L/min and 60 L/min.

When using TMB as the dopant precursor together with $O_2$/Ar plasma activation, due to safety concerns (or possibly other concerns), it may not be appropriate to have the $O_2$ and TMB co-flown together in the reaction chamber. In these embodiments, a pump-to-base and/or inert purge step may follow the steps of introducing and adsorbing dopant precursor, thus removing unadsorbed dopant precursor prior to starting the flow of $O_2$ into the reaction chamber. If $O_2$ is already flowing (perhaps from a previous ALD cycle), the flow may be stopped prior to introducing TMB into the reaction chamber. In some embodiments, it may be appropriate to use a separate line charge step to setup flow of $O_2$ into the chamber after the post-dose purge. A pump-to-base (and optional inert purge) step of removing unadsorbed TMB prior to introducing $O_2$ has been found to prevent gas-phase CVD reactions. Without the pump-to-base (and optional inert purge) step, and all other process parameters remaining the same, the uniformity of a 100× conformal film (100 layers) formed from 100 ALD cycles, was found to degrade from 0.3% to 4%.

The adsorption step of the foregoing described reaction sequences (and other similar related reaction sequences) takes place under conditions whereby the dopant precursor may form an adsorption-limited layer (given a sufficient time duration and a sufficient quantity of precursor)—that is, conformal film growth in a single ALD cycle is limited to the amount of dopant precursor which may be adsorbed at one time onto the surface of the substrate. The self-limiting nature of these reactions results in a deposited film exhibiting an excellent degree of conformality and uniformity with regards to the density of the dopant source contained in the film.

As indicated above, trimethyl borate is one suitable dopant precursor, however, depending on the embodiment, other compounds may also serve as suitable dopant precursors. For instance, other suitable boron-based dopant precursors may include: other alkyl borates such as triethyl borate, triisopropyl borate, and tri-n-butyl borate, as well as trimethylboron, triethylboron, triphenylboron, tri-1-propyl borate, tri-n-amyl borate, B-tribromoborazine, tris(pentafluorophenyl)borane, and other similar boron containing compounds. In addition, dopant sources based upon elements other than boron may also be suitable. Examples include dopant sources based upon gallium, phosphorous, arsenic, or other elements appropriate for doping a semiconductor substrate, such as other valence III and V elements. Particular dopant sources based upon arsenic which may comprise a conformal film deposited via an ALD process may include, but are not limited to, arsenosilicate or arsenic-doped silicate glass (ASG), arsenic oxides (e.g., $As_2O_3$, $As_2O_5$) and arsenic oxyhydrides. Dopant precursors based upon arsenic may include, but are not limited to, the alkylarsine, alkoxyarsine, and aminoarsine chemical families, and include, but are not limited to, the following specific compounds: arsine, triethylaresenate, trimethylarsine, triethylarsine, triphenylarsine, triphenylarsine oxide, ethylenebis(diphenylarsine), tris(dimethylamino)arsine, and $As(OR)_3$ where R is $—CH_3$ or $—C_2H_5$ or other alkyl groups (including saturated and unsaturated alkyl groups), and other similar arsenic containing compounds. Particular dopant sources based upon phosphorous which may comprise a conformal film deposited via an ALD process may include, but are not limited to, phosphorus-doped silicate glass (PSG). Dopant precursors based upon phosphorous may include, but are not limited to, triethoxyphosphine oxide, trimethylphosphate, trimethylphosphite, and other similar phosphorous containing compounds. Choice of dopant precursor is typically dictated by ease of integration into existing delivery systems, purity requirements, and overall cost.

However, in many cases, arsenic appears to have distinct advantages over phosphorus for the purpose of forming conformal film layers to dope an underlying substrate. For instance, arsenic has a much shorter diffusion length in a silicon lattice versus phosphorous, and hence has the potential to dope ultrashallow junctions of less than 20 nm. Second, the solid solubility of arsenic in silicon is higher than that of phosphorus, indicating that a higher concentration of arsenic dopant can be realized in a much narrower junction. Both these properties are advantageous in the context of mitigating short channel effects in scaled devices. However, arsenic spin-on-glass (As-SOG) (see Journal of the Korean Physical Society, Vol. 51, December 2007, pp. S265-S269) seems to be one of very few methods pursued by researchers for ASG, and it has been observed that achieving perfect conformality and thickness control with this technique has been, and will continue to be, a challenge. Accordingly, forming conformal film layers of arsenic based dopant sources, such as arsenic oxides or oxyhydrides, using various ALD based methods disclosed herein, is a useful and preferred technique for doping certain types of device structures.

Figure 2:
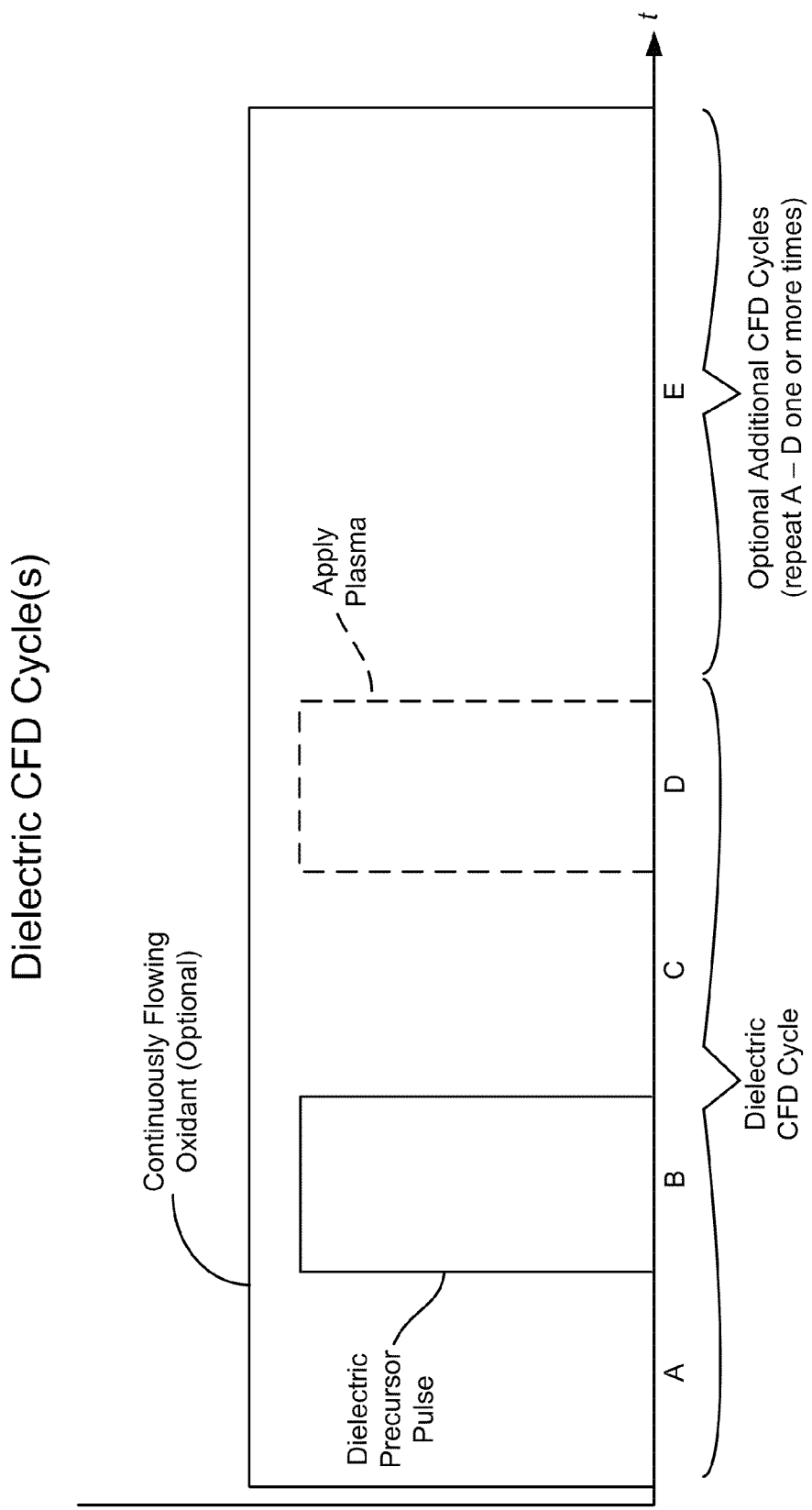
FIG. 2 is a schematic illustration of a sequence of operations which may be used for forming one or more dielectric conformal film layers via a CFD process.
Figure 3:
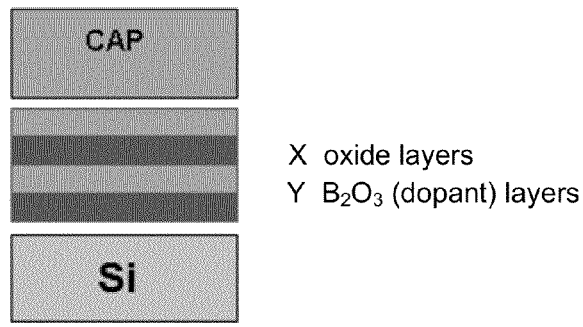
FIG. 3 is a schematic illustration of a conformal film stack having interspersed ALD $B_2O_3$ dopant layers and CFD oxide layers, and also having a capping layer, all deposited on the surface of an underlying semiconductor substrate.

Formation of a Dielectric Conformal Film Layer (e.g. SiO/$SiO_2$ Layer) Via a CFD Process Some of the methods disclosed herein for depositing conformal films (and using the conformal films to dope an underlying semiconductor substrate) involve depositing multiple dopant source containing conformal film layers interspersed with conformal film layers which do not contain a dopant source, but are instead comprised of other constituents. For instance, a dielectric conformal film layer containing SiO/$SiO_2$ may be deposited via a conformal film deposition (CFD) process (as schematically illustrated in FIG. 2), in such a way that the deposited dielectric layer is interspersed with dopant source containing conformal films layers as part of a "stack" of conformal film, as will be described in detail below. In some embodiments, a ALD dopant layer is deposited at the interface or surface of the underlying semiconductor substrate, followed by CFD dielectric layers interspersed with dopant ALD layers every X number of ALD cycles, and optionally topped with an undoped protective "capping" layer which may be a CFD silicon oxide film. Such a "stack" configuration is schematically illustrated in FIG. 3, having $B_2O_3$ serve as the dopant source, and oxide layers serving as the interspersed dielectric layers.

Accordingly, the concept of an dielectric CFD "cycle" is important to various portions of the discussion that follows, and in particular, relevant to portions of the discussion regarding deposition of multiple conformal film layers via multiple dopant ALD "cycles." As with the dopant ALD cycle discussed above, a baseline set of operations which results in the deposition of at least a partial conformal film dielectric layer may be referred to as a single dielectric CFD "cycle." Typically, a dielectric CFD cycle will include only those steps necessary to deliver and adsorb each reactant to the substrate surface, and then react those adsorbed reactants to form the partial layer of dielectric film. Of course, as with the dopant ALD cycle discussed above, the cycle may include certain ancillary steps such as sweeping one of the reactants or byproducts out of the reaction chamber, and/or applying a treatment to the deposited conformal film layer (or partial film layer).

FIG. 2 displays a schematic illustrating a general sequence of operations from left to right with advancing time along the horizontal axis which may be used for forming one or more dielectric conformal film layers via a CFD process. Note that this schematic simply illustrates a baseline sequence of steps and that other ancillary operations may be added, substituted, and/or interspersed with the illustrated operations, depending on the embodiment, and the nature of the dielectric film. Initially in the sequence, during operation A, a vapor phase oxidant is introduced into the reaction chamber that contains the semiconductor substrate onto which the CFD films are to be deposited. Examples of suitable oxidants include elemental oxygen (e.g., $O_2$ or $O_3$), nitrous oxide ($N_2O$), water, alkyl alcohols such as isopropanol, carbon monoxide, and carbon dioxide. The oxidant is oftentimes provided together with an inert gas such as argon or nitrogen.

Next, in operation B, a dielectric precursor is introduced into the reaction chamber. The duration of operation B is chosen to allow the precursor to adsorb onto the substrate surface in an amount sufficient to support one cycle of film growth. In some embodiments, the precursor saturates the substrate surface. The dielectric precursor will be chosen for its ability to produce a dielectric of the desired composition. Examples of dielectric compositions include silicon oxides (including silicate glasses), silicon nitrides, silicon oxynitrides, and silicon oxycarbides. Examples of suitable dielectric precursors include various alkylamino silanes ($SiH_x(NR_2)_{4-x}$) where x=1-3, and R includes alkyl groups such as methyl, ethyl, propyl, and butyl in various isomeric configurations. Examples of suitable dielectric precursors also include various halosilanes ($SiH_xY_{4-x}$) where x=1-3, and Y includes Cl, Br, and I). More specific examples of suitable dielectric precursors include various bis-alkylamino silanes and sterically hindered alkyl silanes. In some embodiments, bis(tert-butylamino)silane (BTBAS) is a suitable dielectric precursor for producing silicon oxide.

The oxidant which was introduced into the chamber during operation A may continue to flow during operation B. In certain embodiments, it continues to flow at the same rate and in the same concentration as during operation A. At the conclusion of operation B, the flow of dielectric precursor into the chamber is terminated and operation C begins as depicted. During operation C, the oxidant (and accompanying inert gas, if present) may continue to flow as during operations A and B to purge potentially remaining unadsorbed dielectric precursor from the reaction chamber. In other embodiments, the flow of oxidant may be shut off, and the purge may be conducted with just an inert gas. In some embodiments (though not depicted in FIG. 2), removal of unadsorbed dielectric precursor from the reaction chamber may be accomplished via a pump-to-base operation similar to that described above.

After removing unadsorbed dielectric precursor during operation C, in operation D the precursor is reacted on the substrate surface to form a portion of the dielectric film. In various embodiments, operation D may involve applying a plasma to the adsorbed dielectric precursor in order to drive its reaction. In some embodiments, the reaction is an oxidation reaction. Some of the oxidant flowing into the reaction chamber may have been adsorbed onto the substrate surface along with the dielectric precursor, thus providing an immediately available oxidizing agent for the plasma-mediated surface reaction. In some embodiments, the flow of oxidant into the reaction chamber may continue through the duration of operation D, as depicted (optionally) in FIG. 2, and an oxidative plasma may be formed using this flowing oxidant in order to drive the oxidation of the adsorbed dielectric precursor.

Operations A through D collectively provide for a single cycle of dielectric CFD film deposition. However, it should be understood that other CFD processes may be used in place of the basic cycle depicted here. In the depicted embodiment, the CFD cycle (consisting of operations A through D) is performed without the introduction of any dopant species or dopant precursor (though, in principle, a dopant could be introduced). In various embodiments, the dielectric CFD cycle represented by operations A through D is repeated one or more times in succession prior to the introduction of any dopant species or dopant precursor. This is schematically illustrated by operation E of FIG. 2. Thus, in some embodiments, operations A through D are repeated at least once, or at least twice, or at least three times, or at least 5 times, or at least 7 times, or at least 10 times prior to initiating a dopant ALD cycle as described above. CFD dielectric film may be deposited at a rate of about or between 0.1 Å and 1.5 Å per CFD cycle, or about or between 0.2 Å and 1.0 Å per CFD cycle, or about or between 0.3 Å and 1.0 Å per CFD cycle, or about or between 0.5 Å and 1.0 Å per CFD cycle. Throughout each of the one or more CFD cycles, the oxidant may continue to flow into the reaction chamber as schematically illustrated in FIG. 2.

In certain embodiments, plasma activation involves RF power of any frequency suitable for causing the reaction of adsorbed dielectric precursor in operation D. In some embodiments, RF power may include independently controlled high-frequency RF power and low-frequency RF power, generated by RF power sources which may be operated independently of one another. Suitable low-frequency RF powers may include, but are not limited to, a frequency range of between about 200 kHz and 1000 kHz. Suitable high-frequency RF powers may include, but are not limited to, frequencies between about 10 MHz and 80 MHz, such as, for example, 13.56 MHz. Likewise, RF power supplies and matching networks may be operated at any suitable power range in order to form a plasma within the reaction chamber. Examples of suitable plasma-generating RF power may include, but are not limited to, an RF power range of between about 100 W and 3000 W for a high-frequency plasma, and an RF power range of between about 100 W and 10,000 W for a low-frequency plasma (on a per wafer basis). The one or more RF power supplies may be operated at any suitable duty cycle. Examples of suitable duty cycles include, but are not limited to, duty cycles of between about 5% and 90%. These RF powers and frequencies may also be suitable for use in the plasma activation operation of the dopant ALD cycle described above.

Suitable reaction chamber pressures for performing operations A through D generally include, but are not limited to, pressures of about or between 0.5 Torr and 5 Torr, and preferably about or between 2 Torr and 4 Torr. For certain plasma pretreatments (of the underlying substrate) prior to exposure to dopant, pressures up to about 10 Torr (or up to about 9 Torr) have been found to work well.

Stack Engineering: Capping Layer

In some embodiments, the dopant source containing conformal film may be hydroscopic, having the ability to adsorb enough ambient moisture to affect its observed physical properties and functionality. For example, a conformal film containing $B_2O_3$, $As_2O_3$, $As_2O_5$, $P_2O_5$, PSG, or ASG deposited via ALD may be hygroscopic and may form hydroxides on exposure to ambient moisture such as volatile boric acid. Volatilization of the boric acid changes the ability of these films to dope an underlying substrate. Thus, it is sometimes beneficial to protect the dopant source containing conformal film layers from exposure to moisture.

Accordingly, prevention or minimization of moisture exposure may be accomplished by employing a capping layer which is deposited atop an underlying dopant source layer or stack of layers, as illustrated in FIG. 3, essentially acting as a physical barrier between these layers and any ambient moisture present in the reaction chamber. FIG. 4(a) illustrates an exemplary A+B stack, with part "B" of the stack serving as the capping layer. In some embodiments, the capping layer may comprise one or more oxides, such as SiO and $SiO_2$, formed from a dielectric precursor deposited and reacted in a CFD process as described above. In some embodiments, the dielectric precursor may be bis(tert-butylamino)silane (BT-BAS). In other embodiments, the capping layer may comprise one or more nitride or oxynitride species. It has been found, in some situations, that without a capping layer, it is not feasible to detect the presence of $B_2O_3$ by thickness metrology.

In some embodiments, the capping layer is engineered by controlling the capping layer chemistry during the deposition process in order to modulate the diffusion characteristic of the dopant toward the underlying semiconductor substrate. Without being limited to a particular theory, it is hypothesized that by depositing a suitable capping layer, back-diffusion of dopant source (i.e. diffusion of dopant away from the film-substrate interface) may be blocked by the capping layer, thereby effectively simulating an infinite reservoir of dopant in the stack.

Stack Engineering: Depositing Multiple Dopant Source Film Layers Via Multiple ALD Cycles Interspersed with Other Film Layers, Such as Dielectric CFD Layers It is possible to deposit multiple dopant source containing conformal film layers sequentially via ALD processes, and in some embodiments, and with some types of dopant precursors, this may be a preferred approach. However, in some cases, it has been found that depositing dopant film layers sequentially, using sequential ALD cycles, tends to be self-inhibiting to some extent. In particular, with TMB serving as dopant precursor, self-inhibition was found to limit TMB nucleation over $B_2O_3$ monolayers to less than 0.2 Å per ALD cycle. Moreover, this growth rate drops further after a certain number of dopant layers have been deposited. In fact, in one experiment, the total thickness of a $B_2O_3$ film deposited using sequential ALD cycles was found to not significantly change between the 50th ALD cycle and the 100th ALD cycle. As a result, for some dopant sources and their corresponding dopant precursors, dopant concentration in a deposited conformal film cannot simply be increased by increasing film thickness or increasing dopant source concentration within the film. For example, referring to FIG. 4(a), the total amount of available $B_2O_3$ cannot be increased simply by increasing the thickness of the "A layer" in the illustrated "A+B stack." This is in contrast to boron containing layers deposited using a CVD process, wherein boron concentration can be modulated simply by increasing the duration of the CVD process, and/or increasing the flow of dopant precursor in order to increase the thickness of the deposited boron containing layer.

Figure 5:
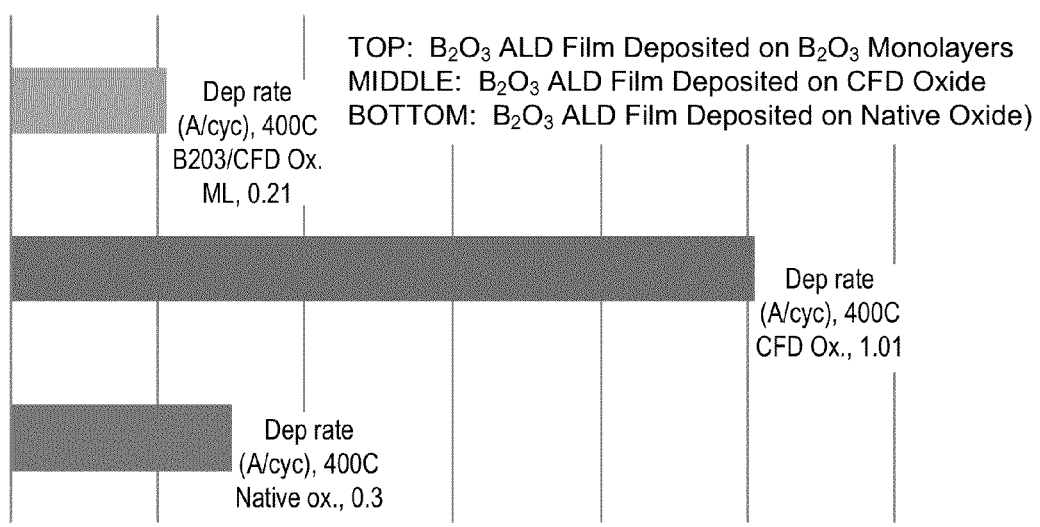
FIG. 5 is a graph comparing growth rates on CFD oxide with growth rates on native oxide and on preexisting $B_2O_3$ monolayer, over 50 cycles of deposition.

However, it has been found that, in some cases, a dopant source containing film layer may experience faster growth when it is formed via ALD atop some non-dopant containing film layer, such as, for example, a non-dopant dielectric layer, or more specifically, a non-dopant oxide layer. Moreover, it has been found that if the aforementioned dielectric layer (e.g. oxide layer) is deposited via a CFD process, the dopant source layer to be formed via ALD atop of it may exhibit even faster growth than it would on a native dielectric layer (e.g., a native oxide layer). For instance, $B_2O_3$ dopant source layers formed from TMB precursor deposited via ALD atop CFD deposited silicon oxide layers were found to exhibit a growth rate of greater than 1 Å per ALD cycle, as shown in FIG. 5. Without being limited to a particular theory, this may be attributable to the larger number of available hydroxyl surface sites which TMB may stick to on a coalesced CFD oxide layer. In some embodiments, an "initiation" layer of CFD oxide may be deposited atop the substrate surface, prior to depositing the first ALD dopant layer, in order to promote growth of the ALD dopant layer and increase boron concentration closest to the dopant source-substrate interface. FIG. 5 also compares growth rate on CFD oxide with growth rates on native oxide and on preexisting $B_2O_3$ monolayer, over 50 cycles of deposition, at a temperature of 400 C, using an oxidative plasma ($O_2$) to activate the adsorbed TMB precursor. As indicated in the figure, dopant ALD layers were found to grow at a rate of 0.3 Å per ALD cycle atop a native silicon oxide layer (down from 1 Å per ALD cycle on CFD oxide), but only 0.21 Å per ALD cycle atop a preexisting $B_2O_3$ monolayer. Thus, non-CFD deposited silicon oxide or hydroxyl-termination containing oxide layers may also promote or increase nucleation rates of ALD dopant layer growth, although, at least in some cases, not to the same extent.

Hence, by nucleating TMB ALD layers on thin CFD silicon oxide layers, the effective boron concentration can be increased for the same total stack thickness. By changing the spacing and/or frequency of these CFD oxide layers throughout the stack, it is possible to fine tune the boron concentration. FIGS. 4(b) and 4(c) illustrate different stacking strategies such as employing nanolaminates and monolayers, respectively. The monolayer laminates are prepared by alternating single cycles of ALD dopant layer deposition with CFD silicon oxide deposition. The nanolaminates are prepared by alternating two or more cycles of ALD dopant layer deposition and two or more cycles of CFD silicon oxide layer deposition. In some cases, more than two sequential cycles of dopant layer and/or oxide layer deposition may be employed in forming nanolaminates. For example, a repeating sequence of deposition cycles used to construct a nanolaminate may be 2:2 (i.e. 2 dopant cycles followed by 2 oxide cycles, the sequence repeated one or more times), or 2:3, or 2:5, or 3:2, or 5:2, and so on. Accordingly, by adjusting deposition sequence and the proportion of dopant cycles to oxide cycles, the dopant concentration (e.g., boron concentration) for a given stack thickness (e.g., about 100 Å-200 Å) may be modulated and controlled.

Figure 6:
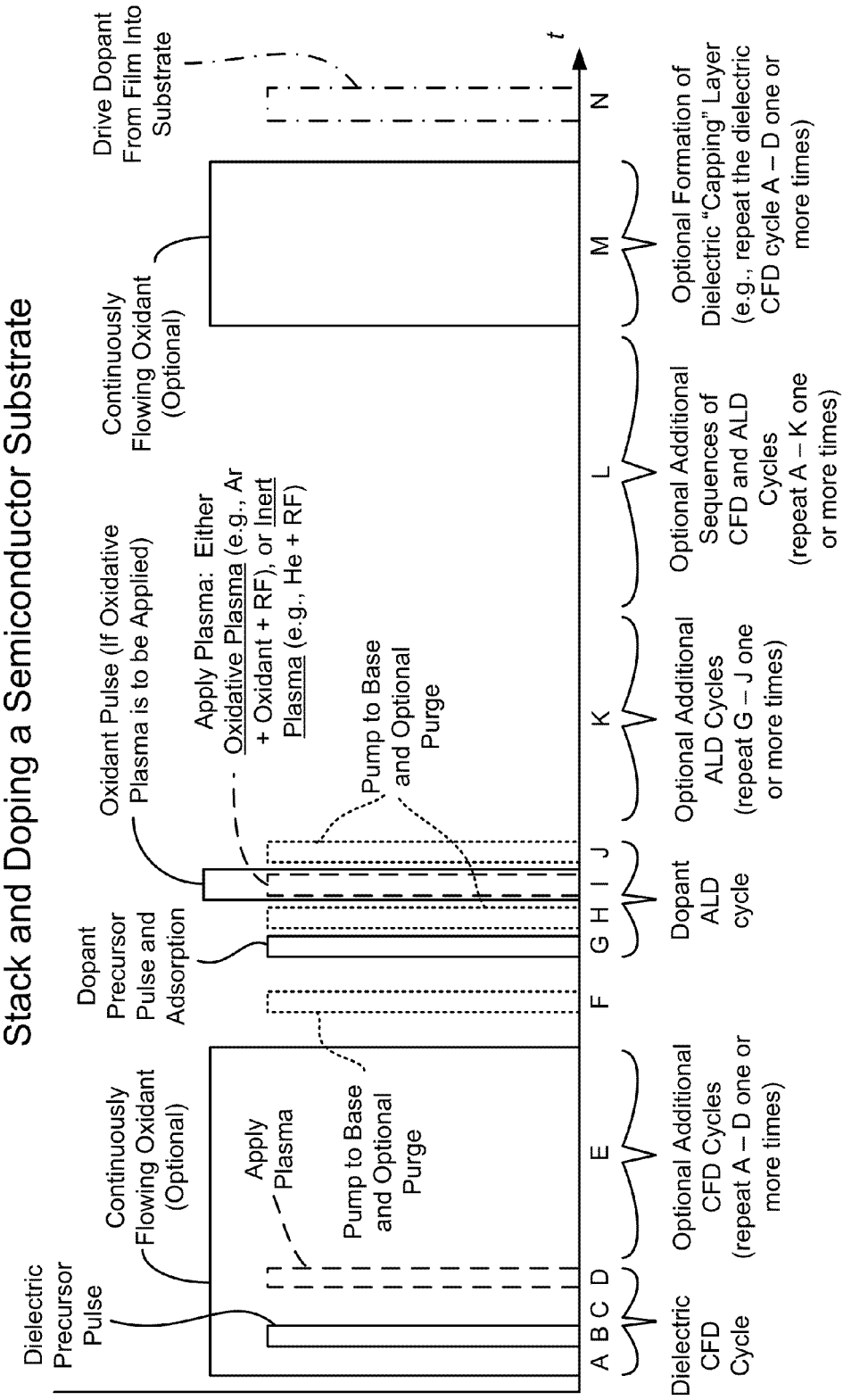
FIG. 6 is a schematic illustration of a sequence of operations which may be used for depositing a stack of conformal film and doping an underlying semiconductor substrate.

Accordingly, FIG. 6 displays a schematic illustrating a sequence of operations which may be used for depositing a stack of conformal film and doping an underlying semiconductor substrate. Once again, the sequence of operations proceeds from left to right with advancing time along the horizontal axis. Also note that once again, as with FIGS. 1 and 2, this schematic simply illustrates a baseline sequence of steps, and that other ancillary operations may be added, substituted, and/or interspersed with the illustrated operations, depending on the embodiment and various considerations. Such considerations may include, for example, the nature of the design of the conformal stack, the choice of dopant source and corresponding choice of corresponding dopant precursor species, and also the chosen composition of the dielectric layer.

Referring to FIG. 6, in this particular embodiment, one or more dielectric layers are deposited first, directly on the surface of the underlying semiconductor substrate (or onto a material adhered to the substrate), using a dielectric CFD cycle which is schematically represented in FIG. 6 by operations A, B, C, and D. Note that the operations A, B, C, and D in FIG. 6 correspond to the A, B, C, and D operations schematically illustrated in FIG. 2, and the discussion above relating to those operations applies here as well. As in FIG. 2, operations A through D represent one dielectric CFD cycle of film growth, and also like FIG. 2, operation E in FIG. 6 schematically illustrates that additional dielectric CFD cycles may follow the initial cycle to deposit additional conformal dielectric film layers. Thus, the baseline process schematically illustrated in FIG. 6 incorporates, and begins with, the baseline dielectric CFD process illustrated in FIG. 2.

Following the deposition of one or more dielectric film layers in operations A through E, the reaction chamber is pumped-to-base (as described above) and optionally purged with an inert gas (as also described above) in operation F. Operation F serves to remove from the reaction chamber any remaining dielectric precursors, oxidative species, or any other remnant species from the preceding dielectric CFD cycles. Of course, in some embodiments, the removal operation F may not be necessary because, for example, there are not significant quantities of remnant species in the reaction chamber after conclusion of the dielectric CFD cycles, or simply because the remnant species do not adversely affect the dopant ALD cycles to follow.

After the first set of dielectric film layers have been deposited, and the reaction chamber prepped (if necessary), the first dopant ALD cycle is performed in operations G, H, I, and J. Operations G through J correspond to operations (i) through (iv) of FIG. 1, and the discussion relating to operations (i) through (iv) of FIG. 1 apply here to operations G through J as well. As described above with respect to operations (i) through (iv), in operation G, a suitable dopant precursor is introduced into the reaction chamber and adsorbed onto the substrate surface (or onto a material adhered to the substrate) under conditions whereby the dopant precursor may form an adsorption-limited layer. Following adsorption of dopant precursor, in operation H, any remaining unadsorbed dopant precursor still present in the reaction chamber is removed via pump-to-base and optional inert purge. Reaction of the adsorbed dopant precursor then takes place in operation I, wherein the reaction proceeds via plasma activation, using inert plasma activation and/or oxidizing plasma activation to form the layer of dopant source containing conformal film. Finally, in operation J, another pump-to-base and/or inert purge is performed to remove any reaction by-products. As described above with respect to operations (i) through (iv), operations G through J collectively represent a single dopant ALD cycle providing a single dopant ALD film layer. As schematically illustrated by operation K of FIG. 6, the ALD cycle represented by operations G through J may be repeated one or more times to form multiple dopant source containing conformal film layers.

At this point in the baseline conformal stack building process schematically illustrated in FIG. 6, an underlying semiconductor substrate has a set of dielectric CFD layers deposited atop of it and another set of dopant ALD layers deposited atop the set of dielectric CFD layers. The set of dielectric CFD layers and set of dopant ALD layers may each have the same number of layers or, in some embodiments, they may have different numbers of layers, as has been described above. In any event, this set of dopant ALD layers may constitute the extent of dopant sources present in the conformal stack. In other words, in some embodiments, no further dopant ALD layers may be deposited. Other embodiments however, may have multiple sets of dopant ALD layers. Thus, for example, in operation L, the sequence of operations A through K may be repeated one or more times, resulting in one or more additional sets of dielectric CFD layers alternating with one or more additional sets of dopant ALD layers. The actual number of times that operations A through K are repeated depends upon the desired total thickness of the conformal film stack, the desired thicknesses of the sets of dielectric and dopant layers, as well as the amount/concentration of dopant intended to be incorporated into the stack. Note further, that if the schematic process of FIG. 6 is strictly followed, the second set of dielectric CFD layers would have the same number of layers as the first set of dielectric CFD layers, and similarly, the second set of dopant ALD layers would have the same number of layers as the first set of dopant ALD layers. However, it is to be understood that the number of layers in each set of successive dielectric CFD and dopant ALD layers may be varied, and in some embodiments, varying the number of layers in this manner may be the preferred approach.

After deposition of dielectric and dopant conformal film layers has been completed, an optional capping layer may be applied in operation M of FIG. 6. Potential capping layers are described above. As indicated in FIG. 6, in some embodiments, the capping layer may be formed by repeating the dielectric CFD cycle of operations A through D one or more times. However, note that the capping layer does not necessarily need to be formed by employing operations A through D. In some embodiments, the capping layer could be formed by employing an entirely different CFD oxide chemistry than that employed in operations A through D; for example, the precursor and/or the plasma may be different. In some embodiments, the CFD deposited capping layer may employ one or more CFD nitride or oxynitride film layers.

After the capping layer has been deposited, a dopant source containing conformal stack according to FIG. 6 has been built/deposited. In some embodiments, for example, the conformal stack may be schematically similar to the conformal stack displayed schematically in FIG. 3 with the dopant source being $B_2O_3$ and the dielectric being one or more oxides. With the conformal stack fully assembled, finally, in an operation N, the underlying substrate may be doped by driving dopant from the conformal stack into the underlying semiconductor substrate. In some embodiments, this may be accomplished by a thermally mediated diffusion process, for example, as detailed below.

Figure 4:
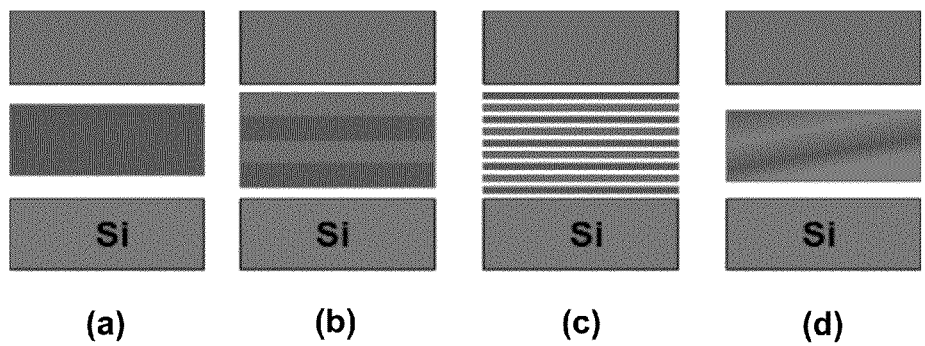
FIG. 4(a) is a schematic illustration of an exemplary A+B stack, with part "B" of the stack serving as the capping layer.
FIG. 4(b) is a schematic illustration of a conformal film stack having ALD dopant layers and CFD dielectric layers interspersed as alternating nanolaminates, and also having a capping layer.
FIG. 4(c) is a schematic illustration of a conformal film stack having ALD dopant layers and CFD dielectric layers interspersed as alternating monolayers, and also having a capping layer.
FIG. 4(d) is a schematic illustration of a conformal film stack having alloyed layers of dopant source and dielectric, and also having a capping layer.

Finally, another stacking strategy which may be used to combine ALD dopant layer deposition with CFD dielectric (e.g. silicon oxide) layer deposition, is to construct a "stack" containing "alloyed layers" as illustrated in FIG. 4(*d*). For example, alloyed layers may be constructed by having the dielectric precursor BTBAS and dopant precursor TMB coflown within the reaction chamber and oxidized simultaneously. Thus, in some embodiments, an alloyed layer may be formed by introducing a dopant precursor and a dielectric precursor into the reaction chamber, coadsorbing both precursors onto the substrate (or onto a material adhered to the substrate) under conditions whereby the dopant precursor and the dielectric precursor form an adsorption-limited layer, and reacting the adsorbed dopant precursor and adsorbed dielectric precursor to form the alloyed layer. In certain such embodiments, the alloyed layer is formed by reacting the adsorbed dielectric precursor with a third reactant which may be an oxidant introduced into the reaction chamber with the dopant and dielectric precursors. In certain such embodiments, reacting the oxidant with the adsorbed dielectric precursor may include activation with a plasma. In other embodiments, the "alloyed layers" shown in FIG. 4(*d*) may be formed by depositing nanolaminates or monolayers as shown in FIGS. 4(*b*) and 4(*c*), respectively, and annealing the layers (typically at a higher temperature, but one that is below the "drive" temperature" to form "alloyed layers," which in some embodiments results in a composite, homogenous glass layer.

Driving Dopant from the Deposited Conformal Film Stack into the Underlying Substrate After the conformal film stack is completely deposited, it may be used as a source of dopant species for nearby semiconductor structures. This may be accomplished by driving the dopant from the deposited film into the device structure. In various embodiments, the driving is accomplished by a thermally mediated diffusion process such as an anneal. In some cases, particularly those employing ultra-shallow junctions, laser spike annealing may be employed.

Apparatuses

Any suitable apparatus may be employed to prepare and use the conformal dopant source containing ALD film layers described herein. For example, the apparatus described in U.S. patent application Ser. No. 13/224,240 may be used. This patent application is hereby incorporated by reference in its entirety herein for all purposes.

In some embodiments, a system controller (which may include a one or more physical or logical controllers) controls all of the activities of a process tool used in a dopant ALD cycle or a dielectric CFD cycle. The system controller executes system control software on one or more processors. The system control software may include instructions for controlling the timing, mixture of gases, chamber and/or station pressure, chamber and/or station temperature, wafer temperature, target power levels, RF power levels, substrate pedestal, chuck and/or susceptor position, and other parameters of a particular ALD/CFD process performed by the process tool. System control software may be configured in any suitable way. For example, various process tool component subroutines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of an ALD/CFD process may include one or more instructions for execution by the system controller. The instructions for setting process conditions for an ALD/CFD process phase may be included in a corresponding ALD/CFD recipe phase. In some embodiments, the ALD/CFD recipe phases may be sequentially arranged, so that all instructions for a ALD/CFD process phase are executed concurrently with that process phase.

Other computer software and/or programs may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto a pedestal and to control the spacing between the substrate and other parts of the process tool.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with the system controller. The user interface may include a display screen, graphical software displays of the apparatus and/or process conditions, and user input devices such as pointing devices, keyboards, touch screens, microphones, etc.

In some embodiments, parameters adjusted by the system controller may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of the system controller from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

The system controller may provide program instructions for implementing the above-described dopant ALD and dielectric CFD cycles and processes. The program instructions may control a variety of process parameters, such as DC power level, RF bias power level, pressure, temperature, etc. The instructions may control the parameters to operate in-situ deposition of conformal film stacks according to various embodiments described herein.

Accordingly, a system controller for providing program instructions to an apparatus for doping a substrate may have machine readable code which may include instructions for detecting the presence of a substrate on a substrate holder within a reaction chamber, instructions for operating one or more dopant precursor gas inlets to introduce dopant precursor into the reaction chamber so that the dopant precursor adsorbs onto the substrate or onto a material adhered to the substrate, instructions for operating one or more gas outlets to evacuate unadsorbed dopant precursor from the reaction chamber, and instructions for reacting the adsorbed dopant precursor to form a film layer containing a dopant source. In some embodiments, the instructions for reacting the adsorbed dopant precursor include instructions for operating an RF generator to excite a plasma which causes the adsorbed dopant precursor to react. In some embodiments, the machine readable code may further include instructions for driving some of the dopant source from the film into the substrate, and in certain such embodiments, these "driving" instructions may further include instructions for operating a heater to heat the film causing a thermally mediated diffusion of dopant from the film into the substrate.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Experiments and Examples

Figure 7:
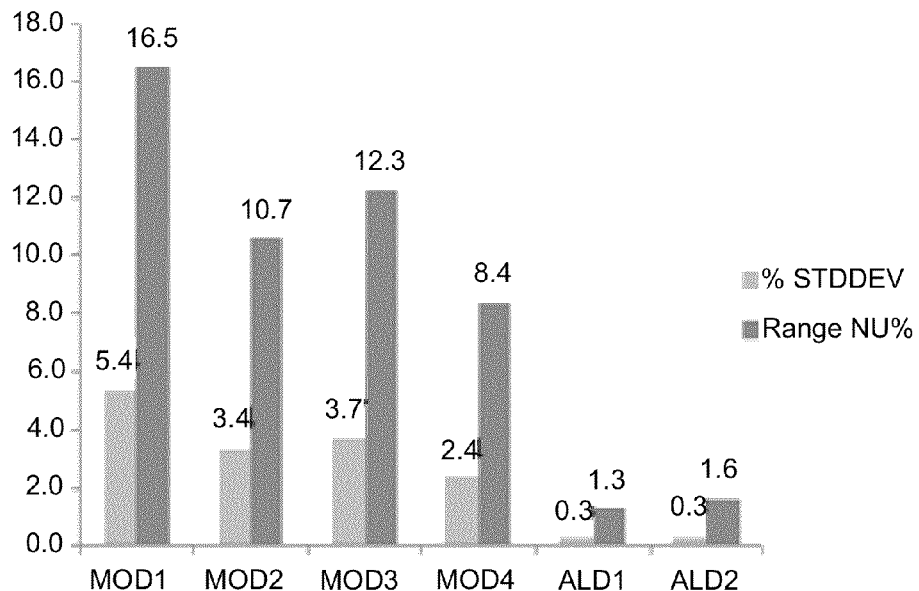
FIG. 7 is a graph comparing within-wafer (WiW) thickness non-uniformity (NU) between several $B_2O_3$ stacks deposited using several different methods.

FIG. 7 compares within-wafer (WiW) thickness non-uniformity (NU) between several $B_2O_3$ stacks deposited using several different methods. Each stack contains conformal film layers of ALD deposited dopant source $B_2O_3$ interspersed with dielectric CFD layers. The first four $B_2O_3$ stacks, MOD1 through MOD4, were deposited via CVD processes having varying deposition temperatures and $B_2H_6$ flow rates, and these stacks exhibit a NU range of ~8-16%. The two $B_2O_3$ stacks deposited via ALD—the ALD1 process employing an inert plasma and the ALD2 process employing an oxidative plasma—exhibit a dramatically improved thickness NU range of ~1.3-1.6%. Note that the "% STDDEV"-labeled bars shown in the plot of FIG. 7 indicate the percent standard deviation in NU measured over multiple wafers.

Figure 8:
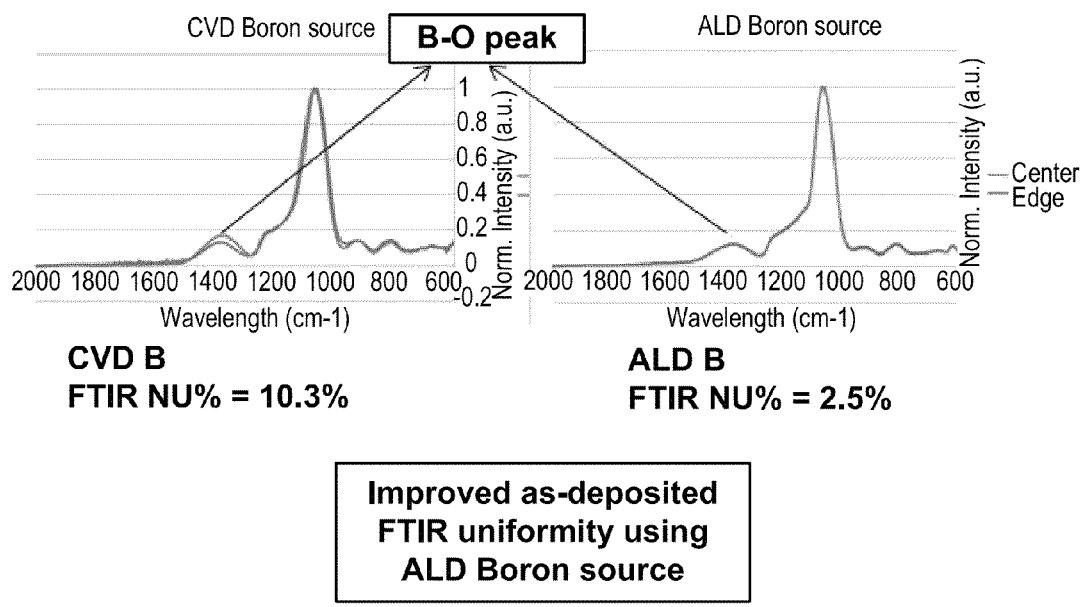
FIG. 8 are the results of 13 point Fourier transform infrared spectroscopy (FTIR) measurements of $B_2O_3$ films formed using ALD versus CFD, taken at the center and edge of a wafer.

FIG. 7 also illustrates the decrease in WiW NU achievable with boron containing conformal films formed using ALD relative to those formed via CVD. Displayed in FIG. 8 are the results of 13 point Fourier transform infrared spectroscopy (FTIR) measurements of $B_2O_3$ films formed using ALD versus CFD. Results for the CVD film are plotted in the left graph and results for the ALD film are plotted on the right. Two curves occupy each graph, one corresponding to the FTIR adsorption spectrum taken at the center of the wafer, and the other corresponding to an adsorption spectrum taken near the wafer edge. For the CVD film, a visible difference in the center and edge adsorption curves (particularly around the boron-oxygen stretching frequency) is visible in FIG. 6 corresponding to a NU of 10.3%. In contrast, the center and edge adsorption curves taken from the ALD film are nearly overlapping, exhibiting a NU of only 2.5%, once again illustrating the improved WiW uniformity achievable using ALD films. These improvements are largely attributable to the substantially complete surface saturation potentially achievable through ALD processes, especially in the thickness regime of interest (around 5-10 nm).

Another way of measuring the within wafer non-uniformity in film stack thickness (WiW NU) is to drive dopant from the stack into the silicon substrate (such as by a spike anneal) and measure the resulting sheet resistance, $R_s$, of the silicon substrate. Since the quantity of dopant available for being driven into the substrate correlates with stack thickness, uniform sheet resistance is indicative of uniform stack thickness. Furthermore, the WiW uniformity of dopant concentration after anneal is itself, obviously, an important consideration in device fabrication. Table 1 lists the mean sheet resistances (mean $R_s$) as well as the percent standard deviations (% Std Dev) of a silicon substrate after stack deposition and spike anneal corresponding to a boron-containing stack deposited using a CVD methodology (CVD-B) and a boron-containing stack deposited using an ALD methodology (ALD-B). Table 1 shows that the ALD film exhibits dramatically improved WiW NU for sheet resistance relative the CVD film, especially within the desired dopant drive values typically employed in semiconductor fabrication, namely 100-5000 ohm/sq. Using ALD, the within-wafer variation in mean sheet resistance can be achieved down to a standard deviation of less than 4%, in contrast to a standard deviation of almost 195% using CVD.

TABLE 1

| Process Condition | Mean Rs | % Std Dev |
| --- | --- | --- |
| CVD-B | 328.69 ohm/sq | 194.8% |
| ALD-B | 423.91 ohm/sq | 5.3% |

Table 2 illustrates the extent to which the various stacking strategies described above may be used to modulate and control dopant concentration. In this particular example, boron concentration was measured in approximately 100 Å thick conformal stacks of ALD $B_2O_3$ and CFD silicon oxide.

TABLE 2

| | Normalized boron concentration (arbitrary units) |
| --- | --- |
| A + B | 32-113 |
| Nanolaminates | 105-307 |
| Monolayers | 240-669 |
| Alloyed layers | <50 |

Hence, by employing different stacking strategies, dopant concentration may be effectively controlled in a regime spanning over two orders of magnitude. Adjustment of stacking strategies and stack engineering, as well as engineering of the capping layer chemistry, may also be used to modulate and control the sheet resistance and its corresponding degree of WiW NU. For instance, Table 3 illustrates the effect of adjusting the ratio and sequence of ALD dopant source layer to CFD oxide layer deposition. Specifically, Table 3 shows the effect of adjusting layer ratio and sequence on the thickness non-uniformity of the as-deposited ALD films (Thx NU) and the sheet resistance WiW non-uniformity ($R_s$, (Drive) NU). Note, that the "2:2" ratio in the table corresponding to the configuration with the lowest sheet resistance WiW NU, means that two $B_2O_3$ layers were deposited followed by two layers of $SiO_2$, and so on. Note that these ALD film stacks were deposited at approximately 200° C., which has consistently resulted in lower $R_s$ NUs in comparison to ALD film stacks deposited at higher temperatures such as, for example, 400° C.

TABLE 3

| (Stack Engineering) | | | |
| --- | --- | --- | --- |
| Stack | B2O3:SiO2 ALD cycles | Thx NU (%) | Rs (Drive) NU (%) |
| NLv1R2X_LT | 2:1 | 11.9 | 13.2 |
| | 2:2 | 4.5 | 5.3 |
| | 2:3 | 0.8 | 69.3 |
| | 2:5 | 0.5 | No drive |
| NLv1R_LT | 1:1 | 5.1 | 31.2 |
| | 1:2 | 1.8 | 60.9 |
| | 1:3 | 1.3 | No drive |

Table 4 illustrates that by modifying the capping layer chemistry, WiW NU may be improved from 41% to 21%.

TABLE 4

| (Cap Engineering) | |
| --- | --- |
| CAP | Rs (Drive) NU % |
| CAP1: $O_2$ oxidizing plasma | 41.13 |
| CAP2: $O_2/N_2O$ oxidizing plasma | 21.17 |

Without being limited to a particular theory, it is hypothesized that by depositing a suitable capping layer, back-diffusion of dopant source (i.e. diffusion of dopant away from the film-substrate interface) may be blocked by the capping layer, thereby effectively simulating an infinite reservoir of dopant in the stack. FIG. 8 schematically illustrates a conformal film stack having a capping layer deposited atop a pattern of alternating ALD dopant source and oxide layers deposited on a silicon substrate.

Figure 9:
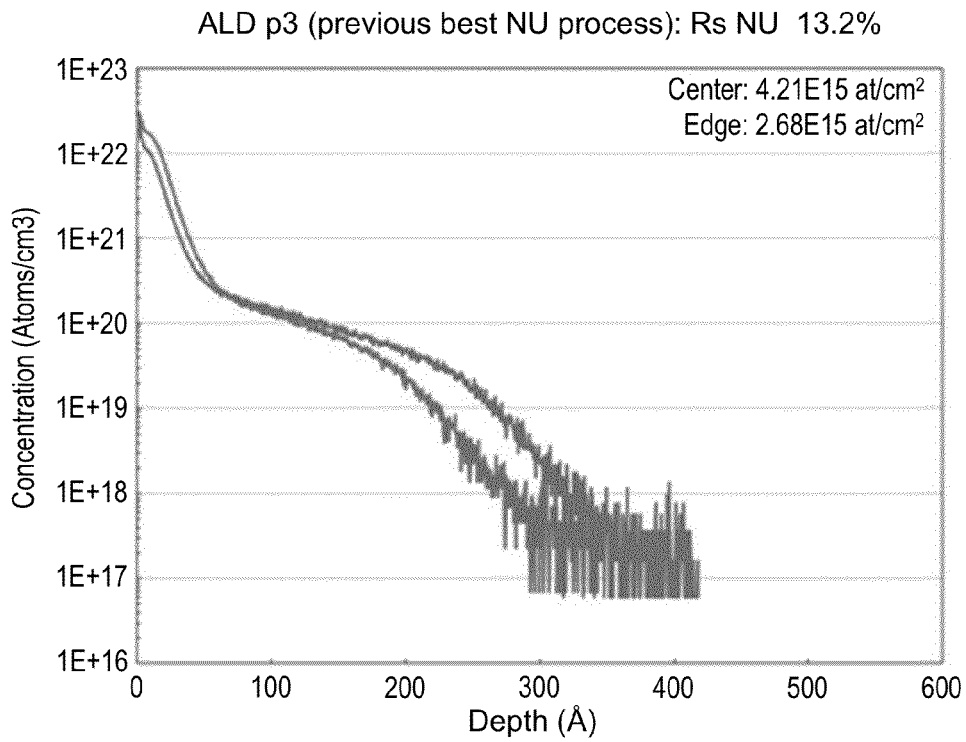
FIG. 9 displays plots of boron concentration versus substrate depth measured at substrate center and edge after doping with a conformal stack.
Figure 10:
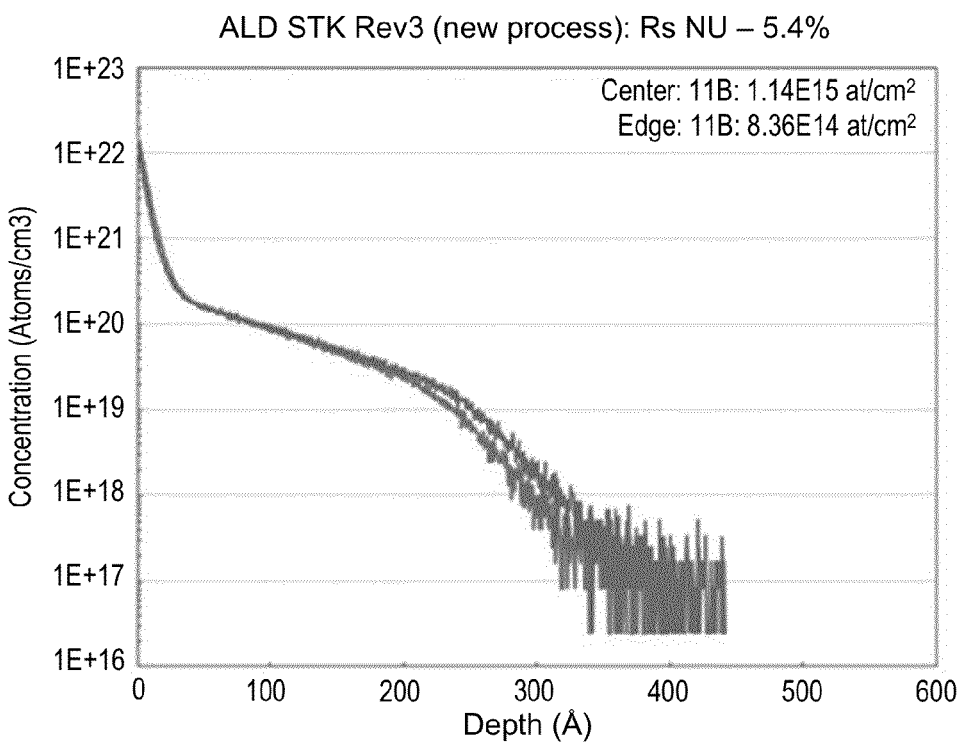
FIG. 10 also displays plots of boron concentration versus substrate depth measured at substrate center and edge after doping with a different conformal stack.

Dopant uniformity in an underlying substrate after transfer from a conformal film stack via spike anneal is exemplified by the boron concentration profiles shown in FIGS. 9 and 10. Both figures plot boron concentration in an underlying silicon substrate as a function of substrate depth measured both at the center and at the edge of the substrate. FIG. 9 displays the results of doping a substrate with the 2:1 ratio stack of Table 3 (having a WiW NU of 13.2%). Clearly visible in the figure is some slight discrepancy between the center and edge dopant concentration profiles as a function of depth. FIG. 10 displays the results of doping a substrate with the 2:2 ratio stack of Table 3 (having a WiW NU of 5.3%). As shown in the figure, with the 2:2 stack, the boron concentration profiles nearly overlay until a depth of approximately 200 Å. Both figures show a high concentration of boron near the substrate surface on the order of 1E22 atoms/cm$^3$, indicating good transfer from the conformal film stacks. Total boron dose ranges from 8.4E14 atoms/cm$^2$ to 4E15 atoms/cm$^2$.

As discussed above, an arsenic or phosphorous based dopant source may also be used in a conformal film stack for doping an underlying semiconductor substrate. For example, FIG. 11(*a*) is a schematic illustration of a sequence of operations for doping an underlying semiconductor substrate using a conformal stack having an arsenic silicate glass (ASG) based dopant layer. In this particular embodiment, the ASG-based conformal stack is formed by first depositing an ASG conformal film via an ALD process, and then by depositing an undoped silicate glass (USG) capping layer via a CFD process. Note, that depending on the embodiment, various arsenic or phosphorous based conformal films may be combined with various types of capping layers, such as the various types of capping layers disclosed herein, for example. Also note that test vehicles similar to that schematically illustrated in FIG. 11(*a*) may be employed using phosphorous silicate glass (PSG) or boron silicate glass (BSG).

Figure 11A:
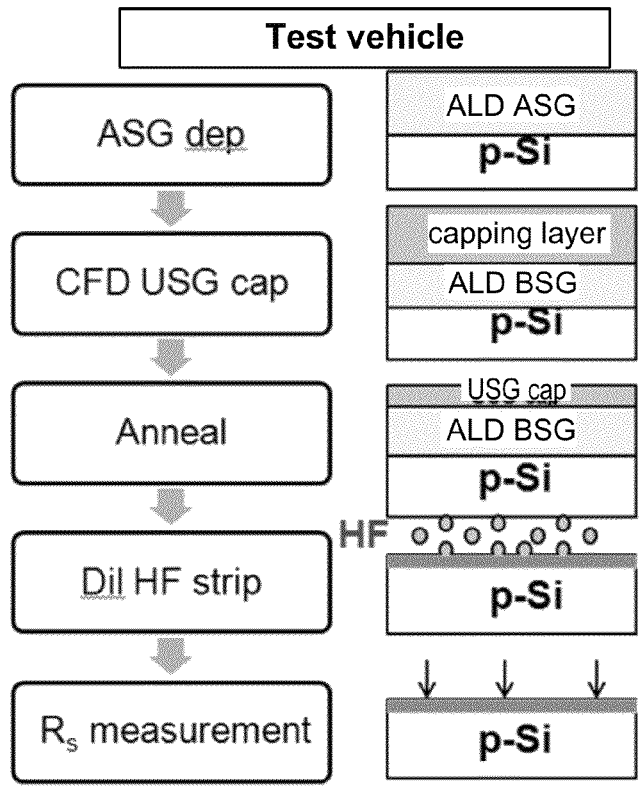
FIG. 11(a) is a schematic illustration of a sequence of operations for doping an underlying semiconductor substrate using a conformal stack having an arsenic silicate glass (ASG) based dopant layer.
Figure 11B:
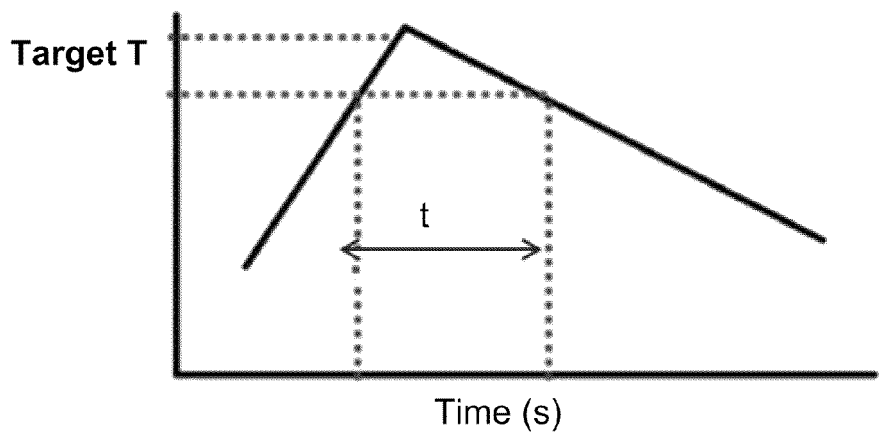
FIG. 11(b) is a schematic plot of an anneal temperature profile.

With the stack in place, a thermal anneal is performed to drive arsenic dopant into the underlying substrate. FIG. 11(*b*) schematically illustrates an anneal temperature profile. In some embodiments, temperature ranges for the anneal may be about or between 800 C and 1100 C, or about or between 850 C and 1000 C, or about or between 875 C and 925 C. In some embodiments, the anneal temperature and the anneal time (i.e. time duration for maintaining the anneal temperature) may be chosen so as to achieve a particular target sheet resistance in the underlying substrate. In some embodiments, an anneal temperature of approximately 900 C and an anneal time of less than 5 sec. may be chosen to achieve a sheet resistance of approximately 600-2000 ohm/sq. FIG. 11(*b*) schematically demonstrates that over the course of the anneal, the temperature is ramped up to (and down from) a max temperature over some durational period defining a temperature profile characteristic of the anneal. Once again, in some embodiments, this temperature profile may be chosen to produce a certain sheet resistance in the underlying substrate.

After the anneal has resulted in the transfer of dopant from the conformal stack to the substrate, in some embodiments, the stack is removed via a stripping operation. In some embodiments, such as that illustrated in FIG. 11(*a*), the stripping operation comprises treatment of the conformal stack with dilute hydrofluoric acid (HF).

Other Embodiments

Numerous variations on this baseline process may be realized. Some of these variations have as their goal increasing the amount of dopant available for diffusion into an adjacent semiconductor structure. Other variations are designed to control the rate at which the dopant is delivered from the source film into the nearby semiconductor structure. Still other variations control the direction that the dopant species diffuse. Frequently, it is desirable to favor the diffusion of the dopant toward the device structure and away from the opposite side of the film. Certain variations are described in U.S. patent application Ser. No. 13/242,084, previously incorporated by reference.

Furthermore, it is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

We claim:

1. A method of doping a patterned substrate in a reaction chamber, the method comprising:
    forming a first conformal film layer directly on a surface of the patterned substrate having three-dimensional features or on a material adhered to the surface, the first conformal film layer comprising a dopant source, the dopant source comprising a dopant, wherein forming the first film layer comprises:
        (a) introducing a dopant precursor into the reaction chamber;
        (b) adsorbing the dopant precursor directly onto the surface or onto a material adhered to the surface under conditions whereby the dopant precursor forms an adsorption-limited layer; and
        (c) reacting the adsorbed dopant precursor to form the dopant source; and
    forming a second conformal film layer comprising the dopant source, after forming the first conformal film layer, wherein forming the second conformal film layer comprises: (a)-(c);
    forming a third conformal film layer comprising a dielectric material, after forming the second conformal film layer, wherein forming the third conformal film layer comprises:
        (i) introducing a dielectric precursor into the reaction chamber;
        (ii) adsorbing the dielectric precursor onto a material adhered to the substrate under conditions whereby the dielectric precursor forms an adsorption-limited layer; and
        (iii) reacting the adsorbed dielectric precursor to form the dielectric material;
    forming a fourth conformal film layer comprising a dielectric material, after forming the third conformal film layer, wherein forming the fourth conformal film layer comprises: (i)-(iii);
    forming a fifth conformal film layer comprising the dopant source, after forming the fourth conformal film layer, wherein forming the fifth conformal film layer comprises: (a)-(c); and forming a sixth conformal film layer comprising the dopant source, after forming the fifth conformal film layer, wherein forming the sixth conformal film layer comprises: (a)-(c);

driving some of the dopant from the first, second, fifth, and sixth conformal film layers into the substrate to form a conformal doping profile in the substrate.

2. The method of claim 1, wherein forming the first, second, fifth, and sixth conformal film layers comprise atomic layer deposition.

3. The method of claim 2, wherein forming the first, second, fifth, and sixth conformal film layers further comprises: (d) removing unadsorbed dopant precursor from the reaction chamber.

4. The method of claim 3, wherein (d) occurs after (a) but prior to (c).

5. The method of claim 4, wherein (d) comprises pumping unadsorbed dopant precursor out of the reaction chamber by pumping the reaction chamber to a base pressure with a vacuum pump.

6. The method of claim 4, wherein (d) comprises purging the reaction chamber with an inert gas.

7. The method of Claim 1, wherein (c) comprises activation with a plasma.

8. The method of claim 7, wherein the plasma is an oxidizing plasma.

9. The method of claim 7, wherein the plasma is an inert plasma.

10. The method of claim 1, wherein the driving of some of the dopant from the first, second, fifth, and sixth conformal film layers comprises a thermally mediated diffusion process.

11. The method of claim 10, wherein the thermally mediated diffusion process involves annealing.

12. The method of claim 11, wherein the annealing is laser spike annealing.

13. The method of claim 1, wherein the dopant comprises a valence III or V element.

14. The method of claim 13, wherein the element is boron, phosphorus, germanium, or arsenic.

15. The method of claim 14, wherein the dopant is boron, the dopant precursor is an alkyl borate, and the dopant source is a boron oxide or boron oxyhydride.

16. The method of claim 15, wherein the alkyl borate is trimethyl borate.

17. The method of claim 16, wherein the boron oxide is $B_2O_3$.

18. The method of claim 14, wherein the dopant is arsenic, the dopant precursor is a selected from the alkylarsine, alkoxyarsine, and aminoarsine chemical families, and the dopant source is an arseno-silicate, an arsenic-doped silicate glass, an arsenic oxide, or an arsenic oxyhydride.

19. The method of claim 18, wherein the dopant precursor is arsine, triethylaresenate, trimethylarsine, triethylarsine, triphenylarsine, triphenylarsine oxide, ethylenebis(diphenylarsine), tris(dimethylamino)arsine, or an arsenic containing compound having the chemical formula $As(OR)_3$ where R is $-CH_3$ or $-C_2H_5$.

20. The method of claim 19, wherein the dopant source is $As_2O_3$ and/or $As_2O_5$.

21. The method of claim 1, wherein the dielectric material of the second and third conformal film layers is $SiO_2$.

22. The method of claim 1, further comprising:
forming a seventh conformal film layer comprising the dielectric material, after forming the sixth conformal film layer, wherein forming the seventh conformal film layer comprises: (i)-(iii);

forming an eighth conformal film layer comprising a dielectric material, after forming the seventh conformal film layer, wherein forming the eighth conformal film layer comprises: (i)-(iii);

forming a ninth conformal film layer comprising the dopant source, after forming the eighth conformal film layer, wherein forming the ninth conformal film layer comprises: (a)-(c);

forming a tenth conformal film layer comprising the dopant source, after forming the ninth conformal film layer, wherein forming the tenth conformal film layer comprises: (a)-(c); and driving some of the dopant from the ninth and tenth conformal film layers into the substrate to form a conformal doping profile in the substrate.

23. The method of claim 1, further comprising:
forming a seventh film layer which is a capping layer, the capping layer being the outermost film layer of the first through seventh film layers relative to the substrate.

24. The method of claim 23, wherein the capping layer comprises $SiO_2$.

25. The method of claim 1, wherein (c) comprises exposing the adsorbed dopant precursor to an oxidant.

26. The method of claim 25, wherein the oxidant is elemental oxygen, nitrous oxide, water, an alkyl alcohol, carbon monoxide, or carbon dioxide.

27. The method of claim 1, wherein (iii) comprises activation with a plasma.

28. The method of claim 1, wherein the dielectric precursor is selected from the group consisting of
alkylamino silanes $(SiH_x(NR_2)_{4-x})$, where x=1-3, and R includes alkyl groups, and
halosilanes $(SiH_xY_{4-x})$, where x=1-3, and Y includes Cl, Br, and I.

29. The method of claim 1, wherein the dielectric precursor is BTBAS.

30. The method of claim 1, wherein each of the first through sixth conformal film layers is a monolayer.

31. The method of claim 1, wherein the average thickness of each of the first through sixth conformal film layers is between 0.1 and 2 Angstroms.

32. The method of claim 1, wherein at least one of the three-dimensional features has a width of not greater than about 40 nanometers.

33. The method of claim 1, wherein the average concentration of dopant over the first through sixth conformal film layers is between about 0.01 and 10 percent by weight.

34. A method of doping a patterned substrate in a reaction chamber, the method comprising:
forming an alloy comprising a dielectric and a dopant source directly on a surface of the patterned substrate having three-dimensional features, or onto a material adhered to the surface, the dopant source comprising a dopant, wherein forming the alloy comprises:
introducing a dopant precursor and a dielectric precursor into the reaction chamber, and coadsorbing the dopant precursor and the dielectric precursor onto the substrate or onto a material adhered to the substrate under conditions whereby the dopant precursor and the dielectric precursor form an adsorption-limited layer; and
reacting the adsorbed dopant precursor and adsorbed dielectric precursor to form the dopant source and alloy having the dopant source; and
driving some of the dopant from the alloy into the substrate to form a conformal doping profile in the substrate.

35. The method of claim 34, wherein forming the alloy further comprises introducing a third reactant into the reaction chamber and reacting the third reactant with the adsorbed dielectric precursor.

36. The method of claim 35, wherein the third reactant is an oxidant.

37. The method of claim 36, wherein reacting the third reactant with the adsorbed dielectric precursor further comprises activation with a plasma.

38. An apparatus for doping a substrate, the apparatus comprising:
- a reaction chamber;
- a substrate holder within the reaction chamber;
- one or more gas inlets coupled to the reaction chamber;
- one or more vacuum pumps;
- one or more gas outlets coupling the reaction chamber to the one or more vacuum pumps; and
- a controller comprising machine readable instructions, the instructions comprising:
  - instructions for forming a first conformal film layer comprising:
    - (a) instructions for operating the one or more gas inlets to introduce dopant precursor into the reaction chamber so that the dopant precursor adsorbs onto the substrate or onto a material adhered to the substrate;
    - (b) instructions for operating the one or more gas outlets to evacuate unadsorbed dopant precursor from the reaction chamber; and
    - (c) instructions for reacting the adsorbed dopant precursor to form a film layer containing a dopant source;
  - instructions for forming a second conformal film layer to be executed after executing the instructions for forming the first conformal film layer, the instructions comprising: (a)-(c);
  - instructions for forming a third conformal film layer to be executed after the instructions for forming the second conformal film layer, the instructions comprising:
    - (i) instructions for operating the one or more gas inlets to introduce a dielectric precursor into the reaction chamber so that the dielectric precursor adsorbs onto a material adhered to the substrate;
    - (ii) instructions for operating the one or more gas outlets to evacuate unadsorbed dielectric precursor from the reaction chamber; and
    - (iii) instructions for reacting the adsorbed dielectric precursor to form a film layer containing the dielectric material;
  - instructions for forming a fourth conformal film layer to be executed after the instructions for forming the third conformal film layer, the instructions comprising: (i)-(iii).

39. The apparatus of claim 38, further comprising an RF generator configured to excite a plasma within the reaction chamber, and wherein (c) comprises instructions for operating the RF generator to excite a plasma which causes the adsorbed dopant precursor to react.

40. The apparatus of claim 38, wherein the instructions comprising the controller further comprise instructions for driving some of the dopant source from the film into the substrate.

41. The apparatus of claim 40, further comprising a heater configured to heat the film containing the dopant source, and wherein the instructions for driving some of the dopant into the substrate comprise instructions for operating the heater to heat the film causing a thermally mediated diffusion of dopant from the film into the substrate.

* * * * *